United States Patent
Sato

(10) Patent No.: US 6,915,319 B1
(45) Date of Patent: *Jul. 5, 2005

(54) METHOD AND APPARATUS FOR INTERPOLATING DIGITAL SIGNAL

(75) Inventor: Yasushi Sato, Nagareyama (JP)

(73) Assignee: Kabushiki Kaisha Kenwood, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/089,939

(22) PCT Filed: Apr. 6, 2000

(86) PCT No.: PCT/JP00/02237

§ 371 (c)(1),
(2), (4) Date: Apr. 5, 2002

(87) PCT Pub. No.: WO01/28092

PCT Pub. Date: Apr. 19, 2001

(30) Foreign Application Priority Data

Oct. 8, 1999 (JP) .......................................... 11/288129

(51) Int. Cl.[7] .......................... G06F 17/10; G06F 17/17
(52) U.S. Cl. ...................................... 708/313; 708/305
(58) Field of Search ................................ 708/290, 305, 708/313; 341/118, 131

(56) References Cited

U.S. PATENT DOCUMENTS 5,493,297 A * 2/1996 Nguyen et al. ............. 341/118
5,590,064 A 12/1996 Astle
5,712,657 A * 1/1998 Eglit et al. .................. 345/690
6,016,113 A * 1/2000 Binder ........................ 341/131

FOREIGN PATENT DOCUMENTS

EP 0 721 286 7/1996
EP 0 865 028 9/1998

OTHER PUBLICATIONS

International Search Report dated May 7, 2000.

* cited by examiner

*Primary Examiner*—Chuong Dinh Ngo
(74) *Attorney, Agent, or Firm*—Eric J. Robinson; Robinson Intellectual Property Law Ofice, P.C.

(57) ABSTRACT

The present invention relates to an interpolation method and an interpolation apparatus for a digital audio signal or a digital image signal that has a predetermined sampling cycle and quantization bit length, and in particular, to an interpolation method and an interpolation apparatus that can effectively reduce quantization noise in a digital signal that is obtained by information compression. In the method and apparatus according to the present invention, it is made to perform interpolation processing of signal levels in a interpolation object interval in a given digital signal in accordance with a predetermined function curve, which monotonously changes, with the interpolation object interval including a discontinuous part that exists between one signal interval, where the same gradation levels continue, and another signal interval, which is adjacent to the one signal interval and in which the same gradation levels that are different continue.

10 Claims, 29 Drawing Sheets

WRITING    x/y TRANSFORMATION    READING

WRITING    y/z TRANSFORMATION    READING

WRITING    z/x TRANSFORMATION    READING

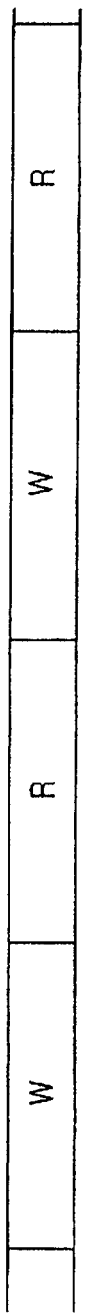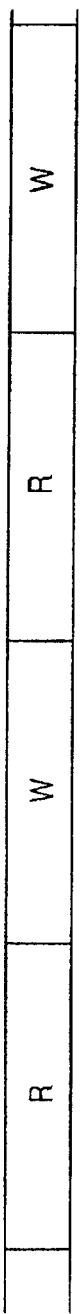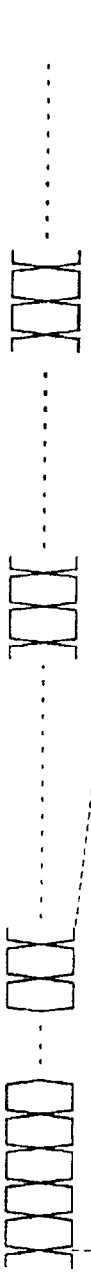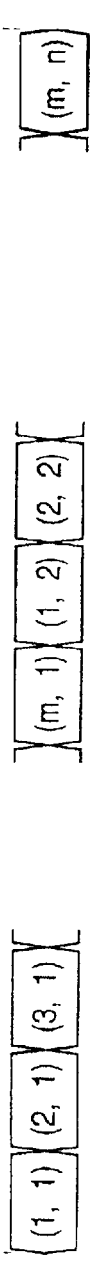
FIG. 29A IMAGE MEMORY I
FIG. 29B IMAGE MEMORY II
FIG. 29C SAMPLING CLOCK Sf
FIG. 29D CONTROL CLOCK F
FIG. 29E R/W ADDRESS
FIG. 29F W ADDRESS
FIG. 29G R ADDRESS

METHOD AND APPARATUS FOR INTERPOLATING DIGITAL SIGNAL

TECHNICAL FIELD

The present invention relates to an interpolation method and an interpolation apparatus for a digital signal, and in particular, to an interpolation method and an interpolation apparatus that can effectively reduce quantization noise even in a digital signal having large quantization noise like a case of decompressing compressed data.

BACKGROUND ART

For example, in the digital recording/playback of audio, video, or the like, original audio, video, or the like are reproduced by recording a digital signal (a series of sampled and quantized levels) in a predetermined recording medium such as semiconductor memory, and an optical disk through A/D conversion of analog signals of the audio, video, or the like, and performing the D/A conversion of the digital signal after reading the digital signal from the recording medium when playing back. If it is desired to save the capacity of the recording medium, it can be performed to shorten quantization bit length when performing the A/D conversion of the analog signals, but quantization noise arises in the digital signal read from the recording medium. For this reason, interpolation processing is performed by not only expanding the quantization bit length of the digital signal, read from the recording medium, by the predetermined bit length toward a low-order side, but also inputting the digital signal to a variable low pass filter whose frequency characteristic (cutoff frequency) dynamically changes according to an input waveform as shown in FIG. 22.

For example, if an original signal is a sinusoidal analog signal as shown in FIG. 23(1), a digital signal after A/D conversion is as shown in FIG. 23(2), but a digital signal the interpolation processing of which is performed by being inputted into a variable low pass filter after bit expansion is as shown in FIG. 23(3), the digital signal is near to the original sinusoidal wave, and hence, it can be seen that quantization noise is considerably improved.

DISCLOSURE OF INVENTION

If a comparatively expensive recording medium such as semiconductor memory is used, it is made to store a digital signal after compressing the digital signal so as to further effectively use memory capacity. If such an irreversible compression method that has a high compressibility but cannot completely restore a waveform to its original waveform is used, for example, if the original signal is a sinusoidal wave as shown in FIG. 23(1), an original digital signal after A/D conversion becomes as shown in FIG. 23(2), and hence quantization noise is not so large yet, but a restored digital signal after compression and decompression becomes as shown in FIG. 24(1), and hence large quantization noise is left. If this restored digital signal is inputted into a variable low pass filter after the quantization bit length of this restored digital signal is expanded by predetermined bit length toward a low-order side, this restored digital signal becomes as shown in FIG. 24(2), and hence the large quantization noise is left yet. There is such a problem that, if it is attempted to make a cutoff characteristic of the variable low pass filter sharp so as to increase an effect of quantization noise reduction, it is not possible to realize the desire since a group delay frequency characteristic becomes worse.

In consideration of the problems of the conventional art described above, an object of the present invention is to provide an interpolation method and an interpolation apparatus that can reduce the quantization noise without deteriorating the group delay frequency characteristic.

The present invention is characterized in that, in a method or an apparatus for processing a digital audio signal or a digital image signal that has a predetermined sampling cycle and quantization bit length, the present invention performs interpolation processing of signal levels within an interpolation object interval in accordance with a predetermined function curve, which monotonously changes, with the interpolation object interval, including a discontinuous part, which exists between one signal interval, where the same levels continue, and another signal interval, which is adjacent to the one signal interval and in which the same levels that are different from the former same level, continue.

A digital signal that is an object of the interpolation processing is a series of quantized amplitude values of an audio signal in case of the digital audio signal, and a series of quantized gradation values or a series of quantized two-dimensional frequency conversion coefficient values of an image signal in case of a digital image signal.

The interpolation processing of the present invention is performed by making a change characteristic of a function curve adaptively change in accordance with a degree of the periodicity of a signal in an interval covering intervals before and after the interpolation object interval.

Then, the interpolation processing makes the characteristic of the function curve change so that the function curve may gently change if the degree of the periodicity of the signal is large, and the function curve may sharply change if the degree is small. In addition, the degree of the periodicity is detected by using frequency analysis or auto-correlation analysis.

Preferably, with letting time length within the interpolation object interval be T, the function curve is made to be adaptively changed according to a level of a Frequency component at a frequency $f=\frac{1}{2}T$.

In addition, as the interpolation object interval, any one kind of interval is selected from among three kinds of intervals such as (i) an interval whose starting point is a start of a preceding same level continuation interval and whose end point is a start of a succeeding same level continuation interval, (ii) an interval whose starting point is an end of a preceding same level continuation interval and whose end point is an end of a succeeding same level continuation interval, and (iii) an interval whose starting point is a nearly median point of a preceding same level continuation interval and whose end point is a nearly median point of a succeeding same level continuation interval.

Furthermore, if a digital image signal is processed in the present invention, not only in the horizontal direction of a frame screen, the present invention makes gradation levels smoothly change along the horizontal direction by performing the interpolation processing in accordance with a predetermined function curve in a predetermined signal interval including a discontinuous part that exists between one signal interval, where the same gradation levels continue, and one signal interval, which is adjacent to the one signal interval and in which the same gradation levels that are different from the former continue, but also in the vertical direction of the frame screen, the present invention makes gradation levels smoothly change along the vertical direction by performing the interpolation processing in accordance with a predetermined function curve in a predetermined signal interval including a discontinuous part that exists between one signal interval, where the same gradation levels continue, and another signal interval, which is adjacent to the one signal interval and in which the same gradation levels that are different from the former continue. This corresponds to a case of processing a static image signal.

If a dynamic image signal is processed, in addition to this, in the interframe direction, the present invention makes gradation levels smoothly change along the interframe direction by performing the interpolation processing in accordance with a predetermined function curve in a predetermined signal interval including a discontinuous part that exists between one signal interval, where the same gradation levels continue, and another signal interval, which is adjacent to the one signal interval and in which the same gradation levels that are different from the former continue.

In addition, the above-described method for processing a digital image signal includes a process of transforming a series of gradation levels in the horizontal direction into a series of gradation levels in the vertical direction after the step of performing the interpolation processing in the horizontal direction, a process of transforming a series of gradation levels in the vertical direction into a series of gradation levels in the interframe direction after the step of performing the interpolation processing in the vertical direction, and a process of transforming a series of gradation levels in the interframe direction into a series of gradation levels in the horizontal direction after the step of performing the interpolation processing in the interframe direction.

Then, the transformation of the series of gradation levels is performed by the reading/writing operation of frame memory, and preferably, with letting N be a natural number, the series of gradation levels is transformed by providing two image memories each having N frames of capacity and repeating reading and writing operation alternately.

BRIEF DESCRIPTION OF THE DRAWINGS

FIGS. 29A–29G are timing charts showing the operation of the circuit in FIG. 28.

BEST MODE FOR CARRYING OUT THE INVENTION

Fundamental Consideration

Figure 1:
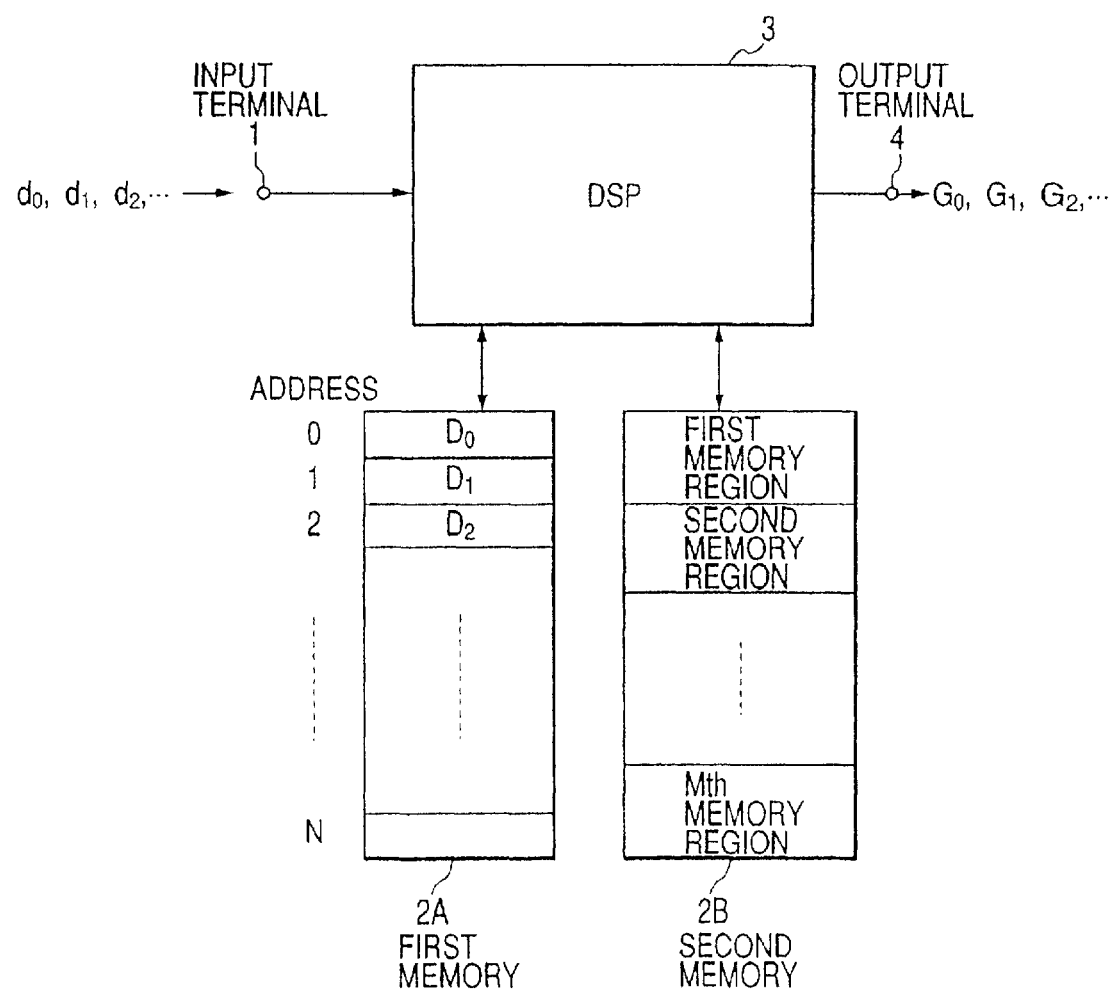
FIG. 1 is a block diagram showing a configuration of an interpolation apparatus according to an embodiment of the present invention.

First, the fundamental consideration of interpolation processing algorithm for a digital signal according to the present invention will be described.

Since plenty of source signals such as music have periodicity, a line spectrum is observed at each of several frequencies by analyzing frequency components by FFT in some time window and viewing a frequency spectrum. In addition, in a digital signal, having large quantization noise, such as a digital music signal, intervals where the same quantization levels continue (hereinafter, the same value continuation intervals) periodically appear frequently.

Generally speaking, it is known that it is possible to perform coding of an original analog signal in the bit length shorter than that in a linear PCM system by performing digital information compression of an audio or image signal by differential PCM (DPCM), adaptive differential PCM (ADPCM), or subband ADPCM, and to communicate or record the signal. Nevertheless, since the digital signal represented in short bit length has large quantization step size, a part that stepwise changes arises if same value continuation intervals that have different values from each other adjoin to each other (see FIG. 9(2)). If an original waveform smoothly changes basically in such intervals, quantization noise arises by this step being decoded as it is. Then, in order to effectively reduce the quantization noise, if it is estimated that the original waveform smoothly changes, the present invention processes the stepped part so that the stepped part may smoothly change by performing level interpolation of the stepped part of the digital signal, which is formed by the same value continuation intervals. On the other hand, if the original waveform sharply changes basically (for example, a pulsed music waveform), the present invention dares not perform the interpolation processing. Since it is considered that a usual signal waveform has a characteristic between these waveform characteristics, the present invention adaptively performs the interpolation processing according to a waveform characteristic estimated. When the characteristic of the original waveform is estimated, the present invention detects a degree of the periodicity, noise characteristics, impulse characteristics, or the like of the original waveform by analyzing a time interval (see FIG. 8), which is widish and includes the intervals before and after a interpolation object interval (including the stepped part changing between the same value continuation intervals that adjoin to each other), by using frequency analysis and auto-correlation analysis.

Embodiments of the Present Invention

The present invention can reduce quantization noise with preventing some frequency component from being remarkably emphasized from the viewpoint of frequency components that an original series of digital data has before and after a first same value continuation interval by detecting a part where two same value continuation intervals, whose values are different from each other in the series of digital data, appear in succession, and performing interpolation according to an interpolation function almost monotonously changing from the start of an interpolation object interval to the start of a second same value continuation interval with all or part of an interval, preceding just before the second same value continuation interval, in the first same value continuation interval as the interpolation object interval. Thus, by analyzing frequency components that the series of digital data has in a predetermined interval also covering intervals before and after the first same value continuation interval and adaptively changing an interpolation function according to the result of the frequency component analysis, it becomes possible to perform such advanced interpolation that the reduction of the quantization noise is preferentially performed if there is a small possibility of some frequency component being especially emphasized from the viewpoint of frequency components that the original series of digital data has in the interval covering intervals before and after the first same value continuation interval even if quantization noise is extensively reduced, and the reduction of the quantization noise is performed as far as some frequency component is not excessively emphasized if there is a large possibility of the frequency component being remarkably emphasized by attempting to extensively reduce the quantization noise.

With letting the time length of the interpolation object interval be T, a component having a frequency $f=\frac{1}{2}T$ is easily emphasized by an interpolation waveform. Then, by adaptively changing the interpolation function according to the amplitude of the component with the frequency $f=\frac{1}{2}T$ that the series of digital data before the interpolation has in the predetermined interval covering the intervals before and after the first same value continuation interval, it becomes possible to preferentially perform the reduction of the quantization noise if there is a small possibility of the component with the frequency $f=\frac{1}{2}T$ being especially emphasized even if quantization noise is extensively reduced, and to perform the reduction of the quantization noise as far as the frequency component is not excessively emphasized if there is a large possibility of the component with the frequency $f=\frac{1}{2}T$ being remarkably emphasized by attempting to extensively reduce the quantization noise.

By adapting an interpolation waveform in the interpolation object interval to the frequency components that a signal waveform of the series of digital data before the interpolation has in a predetermined interval also covering intervals before and after the first same value continuation interval, it becomes possible to reduce the quantization noise with preventing a frequency component from being especially emphasized from the viewpoint of frequency components that the original series of digital data has. Here, "To adapt an interpolation waveform in the interpolation object interval to the frequency components that a signal waveform of the series of digital data before the interpolation has in a predetermined interval also covering intervals before and after the first same value continuation interval" means to perform processing lest needless frequency components should be preferably added by making respective spectrum frequencies of frequency components added by an interpolation waveform overlap, as much as possible, all or part of respective spectrum frequencies by the frequency component that the series of digital data before the interpolation has in the predetermined interval covering the intervals before and after the first same value continuation interval, and more preferably, means to prevent a frequency component from being excessively emphasized, the frequency component added by an interpolation waveform being included in frequency components that the signal waveform of the series of digital data before the interpolation has in the predetermined interval covering the intervals before and after the first same value continuation interval.

Interpolation processing of the present invention changes an interpolation function that adaptively determines an interpolation waveform according to the result of frequency component analysis by FFT of a series of digital data before the interpolation in a predetermined interval covering the intervals before and after the first same value continuation interval, and lets the time length of the interpolation object interval be T, lets an amplitude value of a frequency $\frac{1}{2}T=f_s/2L_2$ be $q_a$, lets the relative length of its spectrum be $r_a$, lets an amplitude value of a frequency $f_{max}$ whose amplitude value is the largest be $q_{max}$, and lets the relative length of its spectrum be $r_{max}$. Here, as an example, an interpolation function is adaptively changed according to the relative amplitude of $r_a$ to $R_M$.

Concretely, a normalized first function $F_1(x)$ is defined as follows:

$$F_1(x)=(\tfrac{1}{2})-(\tfrac{1}{2})\cdot\cos(x\pi/2)$$

where x=0, . . . , 2.

Figure 11A:
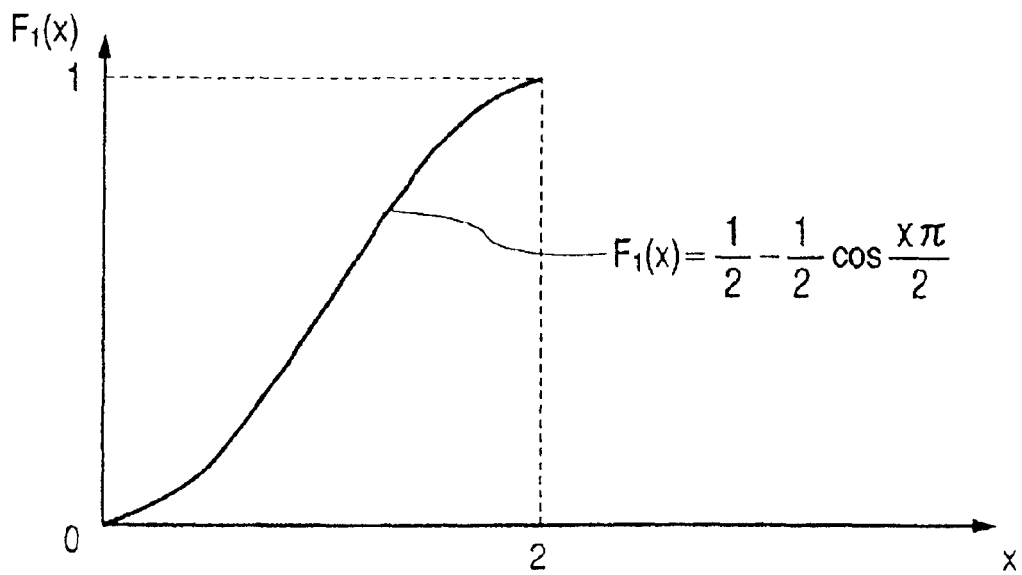
FIGS. 11A and 11B are diagrams for explaining interpolation functions.
Figure 11B:
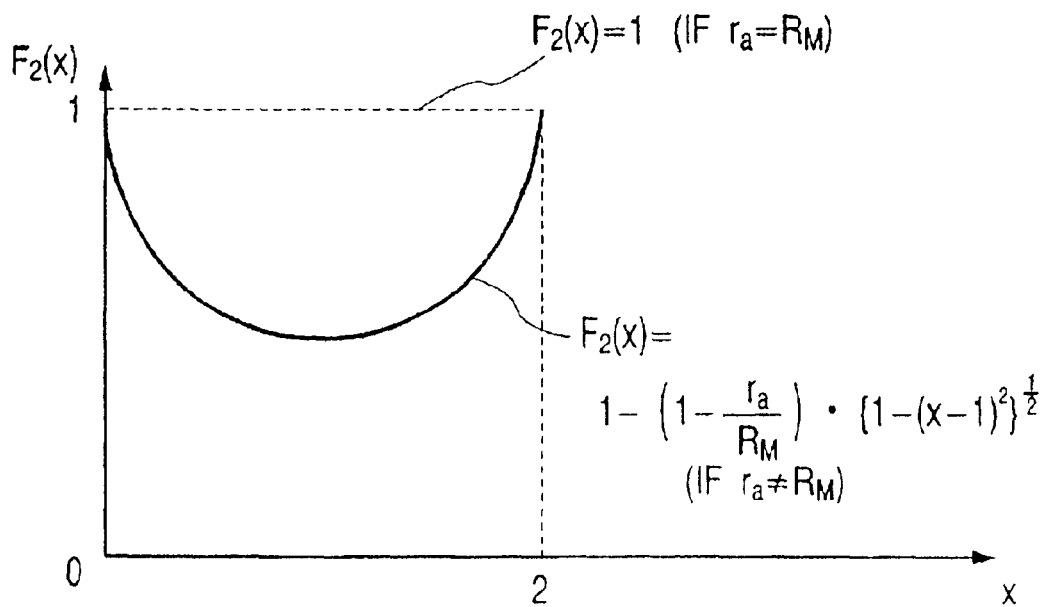

The function $F_1(x)$ is shown in FIG. 11(1), the function $F_1(x)$ which sinusoidally and monotonously increases from 0 to 1 within a range of x=0, . . . , 2.

Further, a normalized second function $F_2(x)$ is defined as follows:

if $R_a \neq R_M$, $$F_2(x) = 1 - \{1-(r_a/R_M)\} \cdot \{1-(x-1)^2\}^{1/2}$$

or, if $r_a = R_M$, $F_2(x) = 1$ where $x = 0, \ldots, 2$. The function $F_2(x)$ is shown in FIG. 11(2), the function $F_2(x)$ which changes along an elliptical curve within a range from the minimum value=$1-\{1-(r_a/R_M)\}$ to the maximum value=1 within a range of $x=0, \ldots, 2$ (if $r_a \neq R_M$), or has a constant value, that is, 1 within the range of $x=0, \ldots, 2$ (if $r_a = R_M$).

A function $G(x)$ is defined as follows:

$$G(x) = F_1(x) \cdot F_2(x)$$

where $x = 0, \ldots, 2$, and an interpolation function $Y(S_1+j)$ that adaptively changes according to the relative amplitude of $r_a$ to $R_M$ is defined as follows (j is a discrete variable; $S_1+j$ expresses an address of first memory 2A):

$$Y(S_1+j) = Y_1 + (Y_2-Y_1) \cdot G(2j/L_2)$$

where $j = 1, 2, \ldots, (L_2-1)$.

For example, if $r_a = R_M$, $F_2(x)=1$, and hence $G(x)=F_1(x)$. Therefore, digital signals in the interpolation object interval are interpolated by a sinusoidal waveform having a frequency of $f_s/2L_2$ so as to monotonously increase from the start of the interpolation object interval to the start of the second same value continuation interval (see an interpolation curve A and interpolation data $D_{3,1}$, $D_{4,1}$, and $D_{5,1}$ in FIG. 10(1)). At this time, the quantization noise is drastically reduced. Since a frequency component with $f_s/2L_2$ that has large value exists from the beginning with viewing it in a predetermined interval before and after including the first same value continuation interval out of the original series of digital data if $r_a=R_M$, grating noise is never created even if this interpolation object interval is interpolated with the sinusoidal waveform with the frequency of $f_s/2L_2$.

Figure 10A:
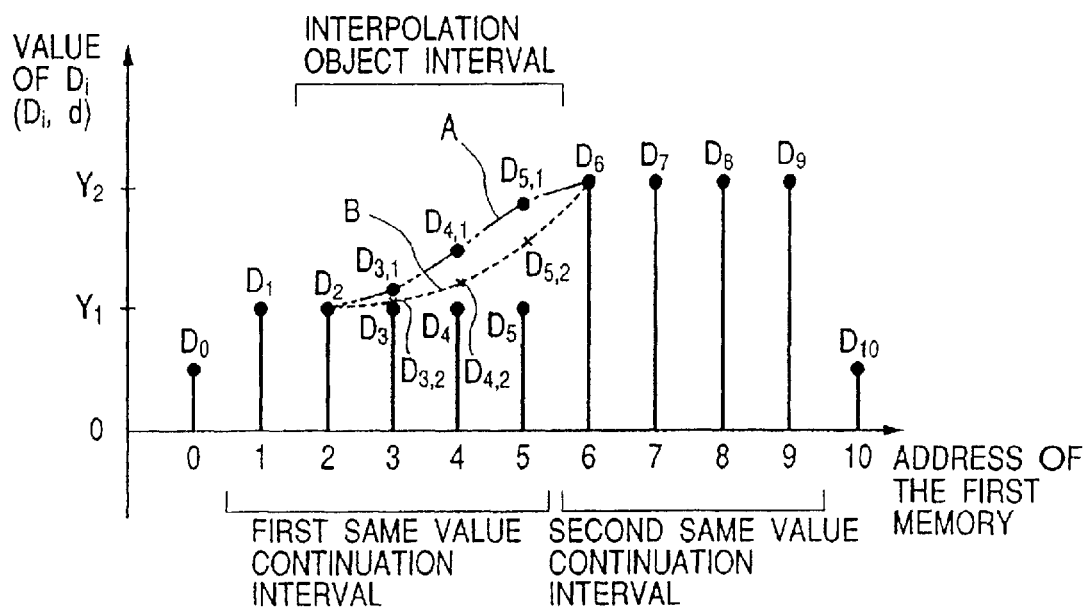
FIGS. 10A and 10B are explanatory diagrams showing the interpolating operation of the DSP in FIG. 1.
Figure 10B:
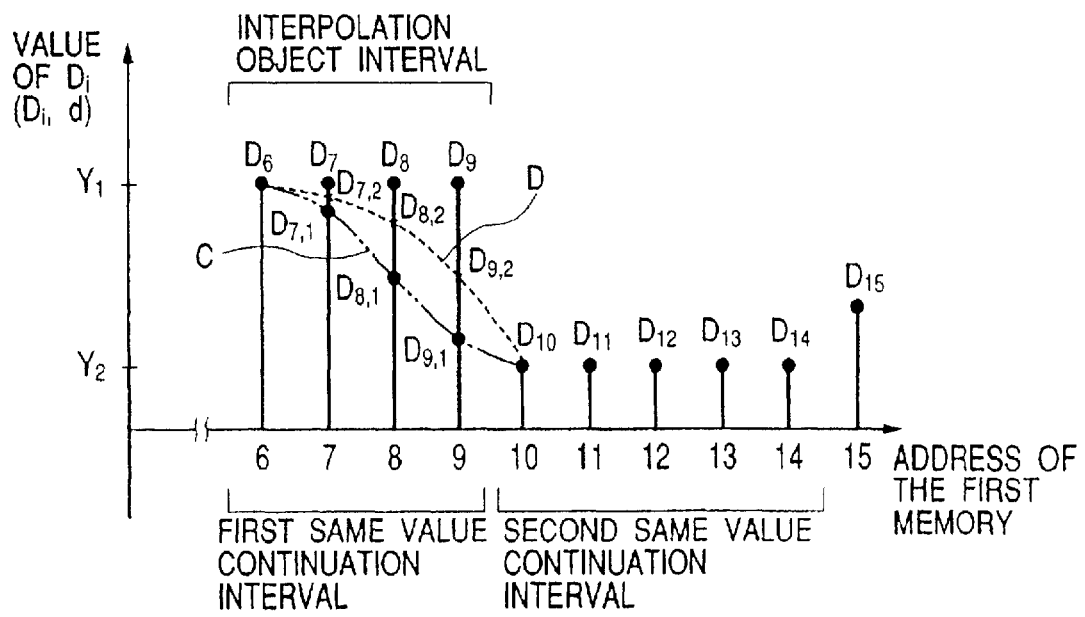

In addition, if $r_a = R_M/2$, digital signals in the interpolation object interval are interpolated along a waveform curve that is created by a little crushing the sinusoidal waveform with the frequency of $f_s/2L_2$ in the direction of approaching to the original shapes of the first same value continuation interval and second same value continuation interval (see an interpolation curve B and interpolation data $D_{3,2}$, $D_{4,2}$, $D_{5,2}$ in FIG. 10(1)). At this time, although the reduction of the quantization noise is a little small, it is possible to prevent the grating noise from being emphasized by the interpolation waveform since the frequency component with $f_s/2L_2$ is not large with viewing it in a predetermined interval before and after including the first same value continuation interval out of an input series of digital data.

On the other hand, for example, if $r_a=R_M$, $F_2(x)=1$, and hence $G(x)=F_1(x)$. Therefore, digital signals in the interpolation object interval are interpolated by a sinusoidal waveform having a frequency of $f_s/2L_1$, so as to monotonously increase from the start of the interpolation object interval to the start of the second same value continuation interval (see an interpolation curve C and interpolation data $D_{7,1}$, D8,1, and $D_{9,1}$ in FIG. 10(2)). At this time, the quantization noise is drastically reduced. Since a frequency component with $f_s/2L_1$ that has a large value exists from the beginning with viewing it in a predetermined interval before and after including the first same value continuation interval out of the input series of digital data if $r_a=R_M$, grating noise is never created even if this interpolation object interval is interpolated with the sinusoidal waveform with the frequency of $f_s/2L_1$.

In addition, if $r_a=R_M/2$, digital signals in the interpolation object interval are interpolated along a waveform curve that is created by a little crushing the sinusoidal waveform with the frequency of $f_s/2L_1$ (see an interpolation curve D and interpolation data $D_{7,2}$, $D_{8,2}$, $D_{9,2}$ in FIG. 10(2)). At this time, although the reduction of the quantization noise is a little small, it is possible to prevent grating noise from being emphasized by the interpolation waveform since the frequency component with $f_s/2L_1$ is not large with viewing it in the predetermined interval before and after including the first same value continuation interval out of an input series of digital data.

Although the function expressing half-wave length of sinusoidal curve is selected as an interpolation function in the embodiment described above, the present invention is not limited to this, but, for example, a function expressing quarter-wave length of sinusoidal curve can also be selected. In this case, with paying attention to a component with $f=\frac{1}{4}T$ in the result of FFT analysis, similar processing is performed. Furthermore, another monotone increasing or monotone decreasing function can also be used as the interpolation function.

As described above, by analyzing frequency components that the series of digital data before interpolation has in a predetermined interval also covering intervals before and after the first same value continuation interval and adaptively changing an interpolation function according to the result of the frequency component analysis, the present invention preferentially performs reduction of the quantization noise if there is a small possibility of a frequency component being especially emphasized from the viewpoint of frequency components that the series of digital data before interpolation has before and after the first same value continuation interval even if quantization noise is extensively reduced, and performs the reduction of the quantization noise as far as a frequency component is not excessively emphasized if there is a large possibility of the frequency component being remarkably emphasized by attempting to extensively reduce the quantization noise.

Concretely, with letting the time length of the interpolation object interval be T, a component having a frequency $f=\frac{1}{2}T$ is easily emphasized by an interpolation waveform. Then, by adaptively changing the interpolation function according to the amplitude of the component with the frequency $f=\frac{1}{2}T$ that the series of digital data before the interpolation has in the predetermined interval covering the intervals before and after the first same value continuation interval, it becomes possible to preferentially perform the reduction of the quantization noise if there is a small possibility of the component with the frequency $f=\frac{1}{2}T$ being especially emphasized even if quantization noise is extensively reduced, and to perform the reduction of the quantization noise as far as the frequency $f=\frac{1}{2}T$ is not excessively emphasized if there is a large possibility of the component with the frequency $f=\frac{1}{2}T$ being remarkably emphasized and a feeling of strangeness in auditory sensation arises by attempting to extensively reduce the quantization noise.

Figure 12A:
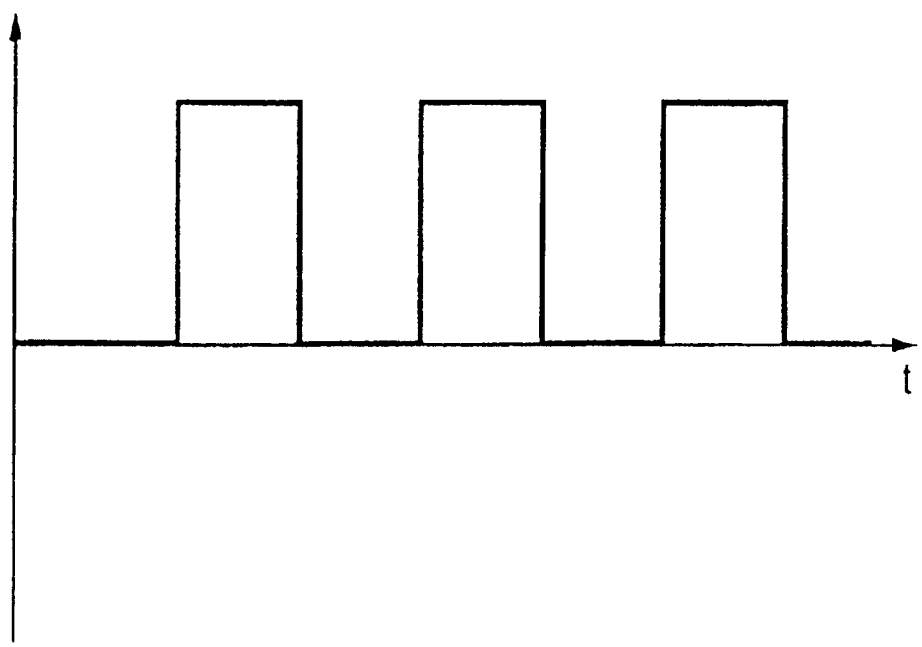
FIGS. 12A and 12B are diagrams showing interpolating operation by an interpolation apparatus.
Figure 12B:
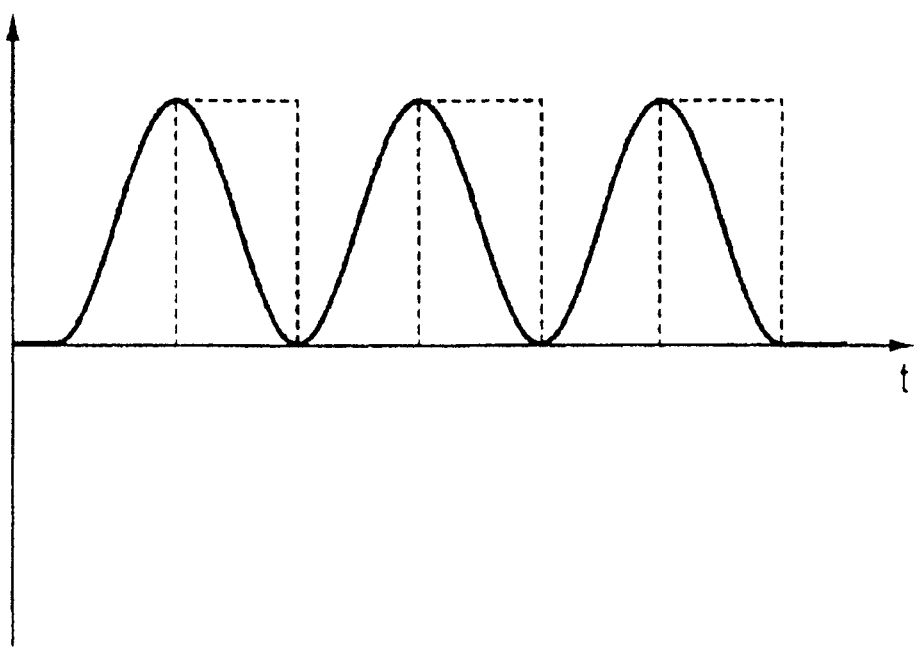
Figure 13:
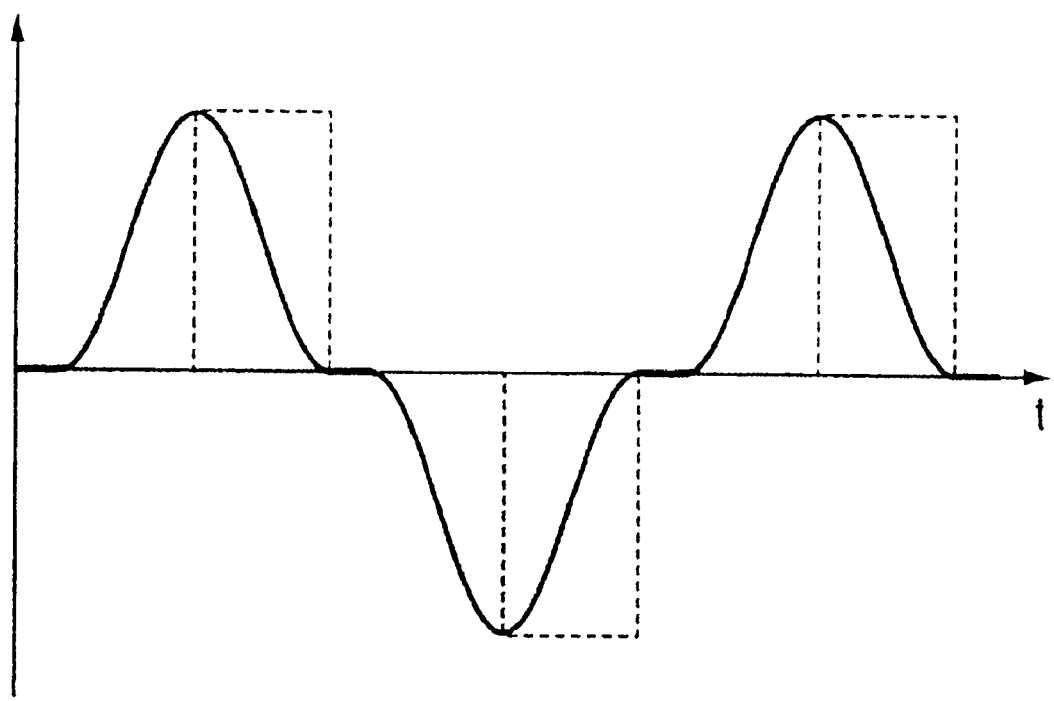
FIG. 13 is a diagram showing interpolating operation by the interpolation apparatus in FIG. 1.
Figure 20:
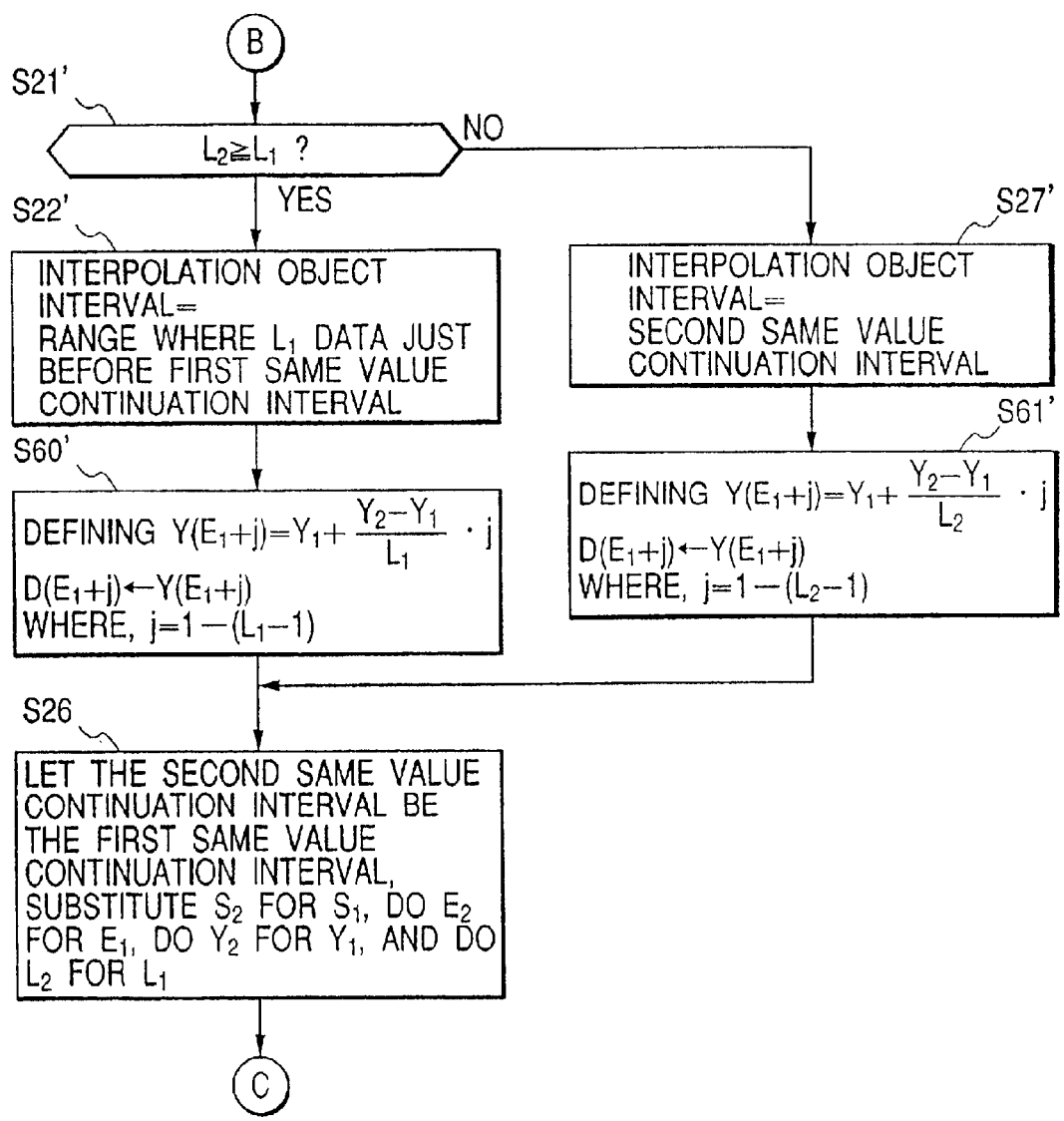
FIG. 20 is a flow chart showing the main processing of the DSP according to another example modified from that in FIG. 1.
Figure 21A:
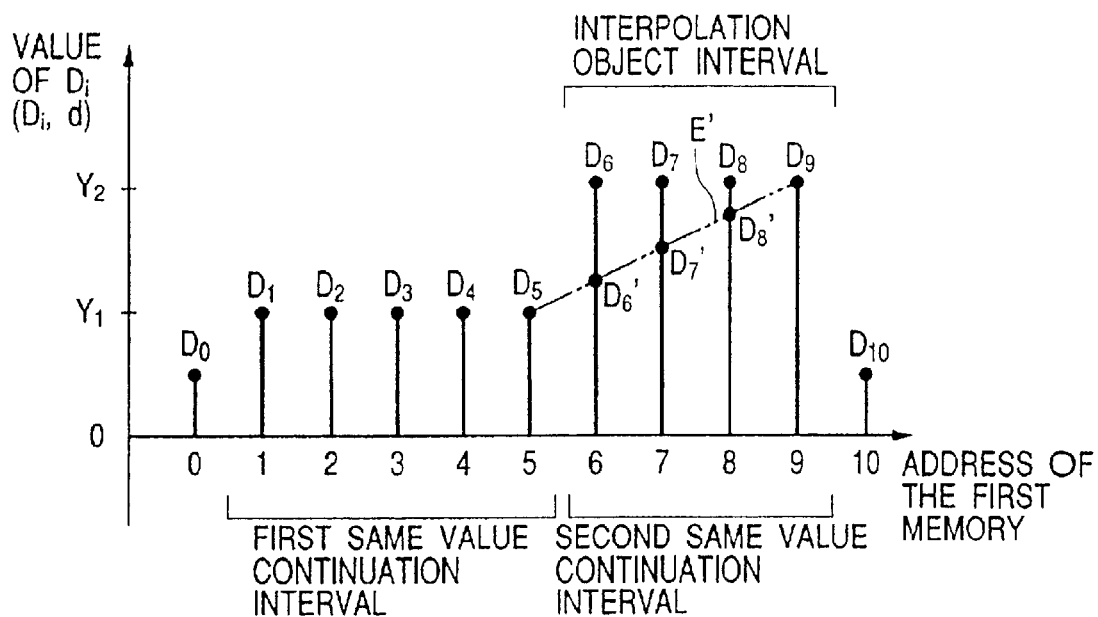
FIGS. 21A and 21B are diagrams showing another embodiment of 25 interpolating operation by a straight line.
Figure 21B:
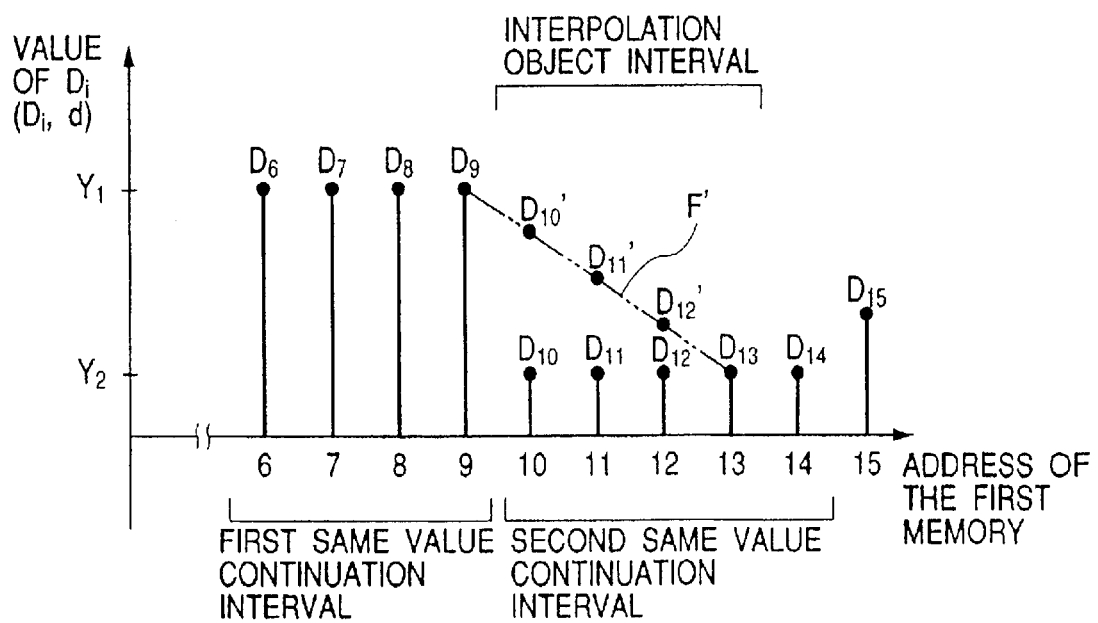
Figure 22:
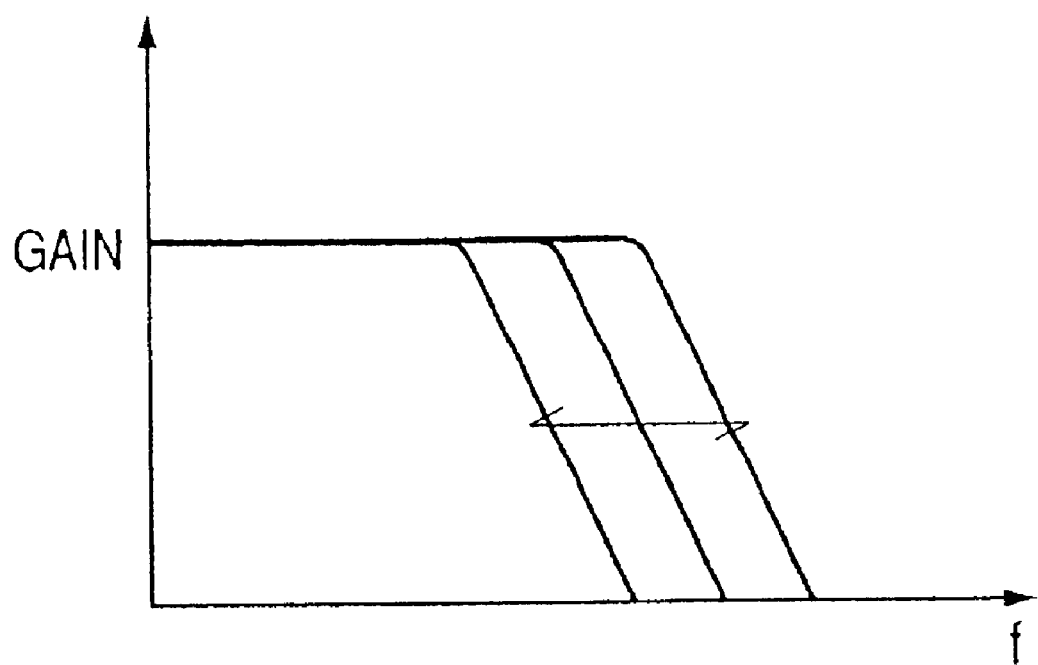
FIG. 22 is a graph showing frequency characteristics of a conventional variable low pass filter.
Figure 23A:
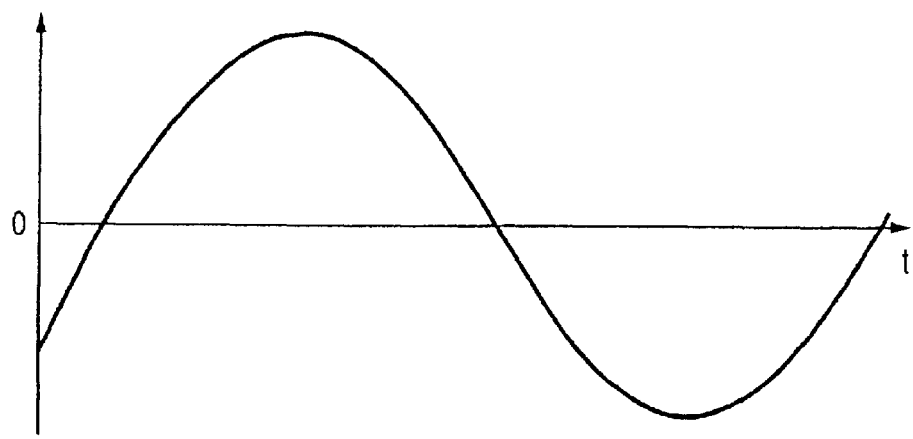
FIGS. 23A–23C are diagrams for explaining the interpolating operation of a conventional variable low pass filter style.
Figure 23B:
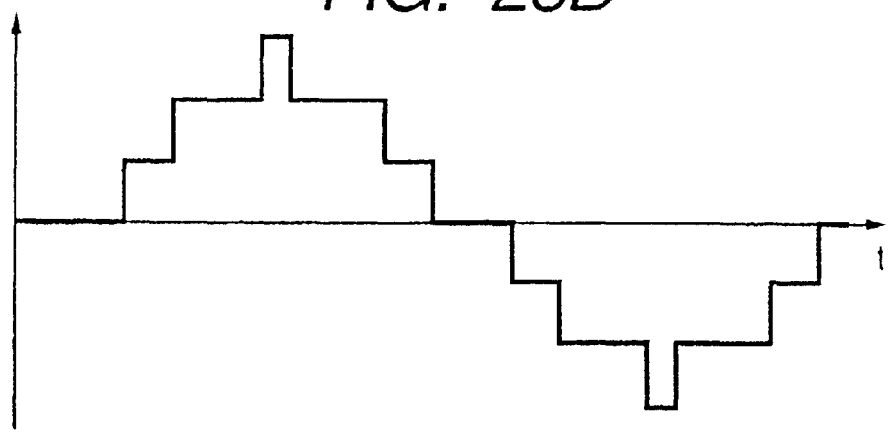
Figure 23C:
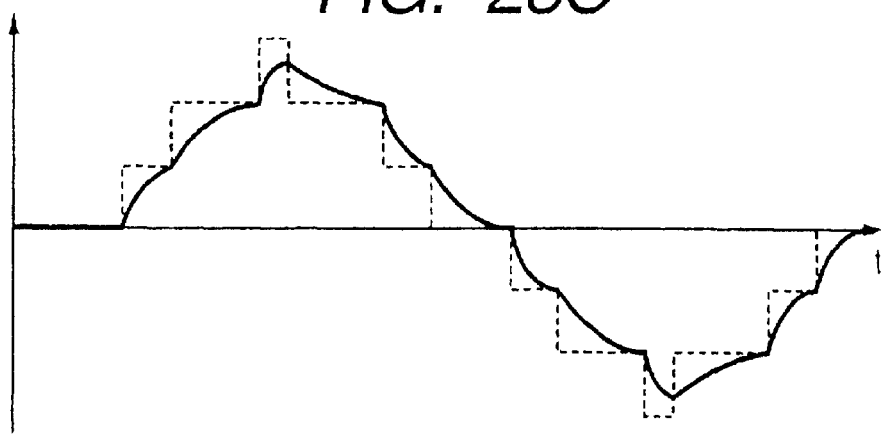
Figure 24A:
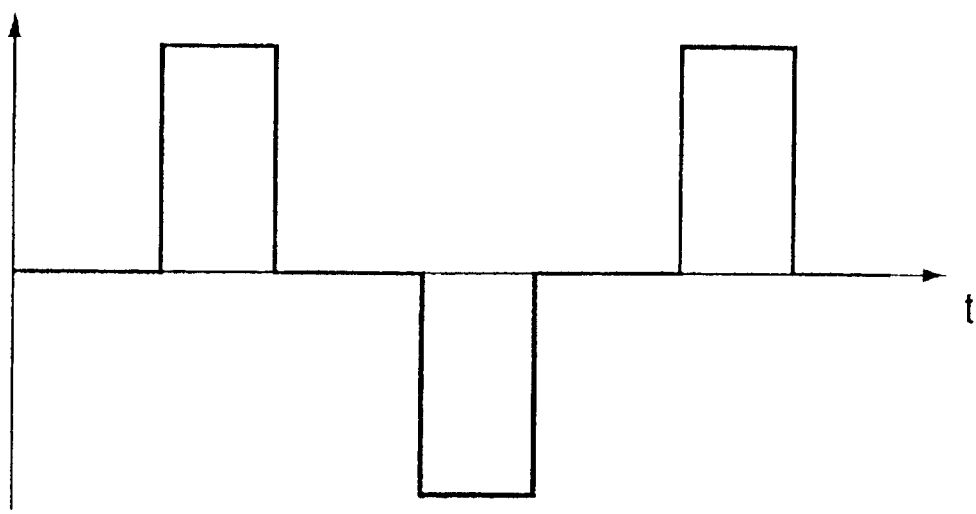
FIGS. 24A and 24B are diagrams for explaining the interpolating operation of a conventional variable low pass filter style.
Figure 24B:
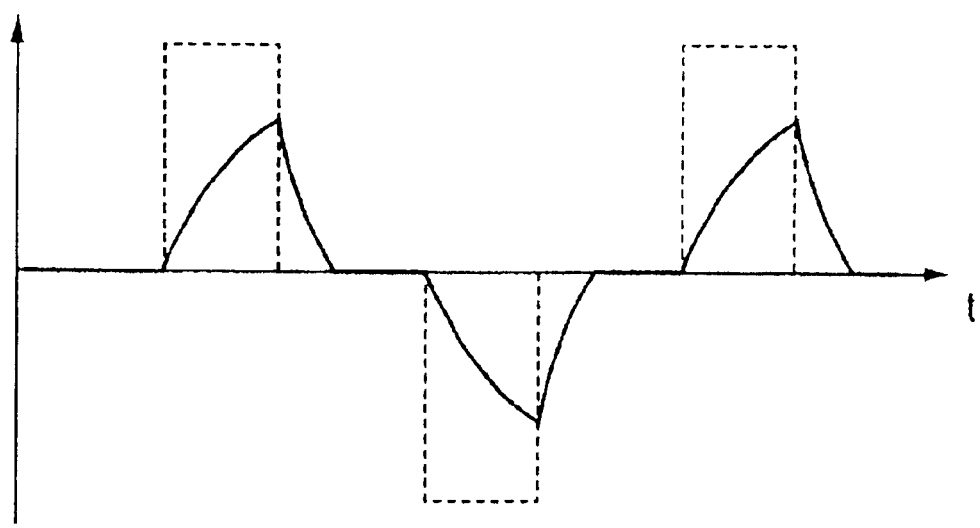

In consequence, for example, if an input series of digital data is as shown in FIG. 12(1), an output of an interpolation apparatus according to this embodiment is as shown in FIG. 12(2), and hence it can be seen that the quantization noise is drastically reduced. In addition, if an input series of digital data is as shown in FIG. 20(1), an output of the interpolation apparatus according to the present invention is as shown in FIG. 13, and hence it can be seen that it is possible to suppress the quantization noise in comparison with a case of using a conventional low pass filter (see FIG. 24(2)).

In addition, although the embodiment described above adaptively changes the interpolation function on the basis of the result of performing the frequency analysis (that is, the FFT analysis) of signals in the signal interval also covering intervals before and after the interpolation object interval, analysis can be used instead of the FFT analysis, the analysis which is defined in the following equation and uses a short-time auto-correlation function.

$$\Phi(\tau) = \int_{M_1}^{M_2} W(t) \times S(t-\tau) dt$$

where W(n): Window function; and
S(n): Sampling signal.

In this case, with paying attention to a value of a normalized auto-correlation function $\Phi(2T)/\Phi(0)$ at the time of $\tau=2T$, the interpolation apparatus changes the interpolation function.

Furthermore, although the embodiment described above sets an interpolation object interval, whose length is the same as that of the second same value continuation interval, in the first same value continuation interval out of the first same value continuation interval and the second same value continuation interval, it can be performed in the contrary to set an interpolation object interval, whose length is the same as that of the first same value continuation interval, in the second same value continuation interval.

Figure 16A:
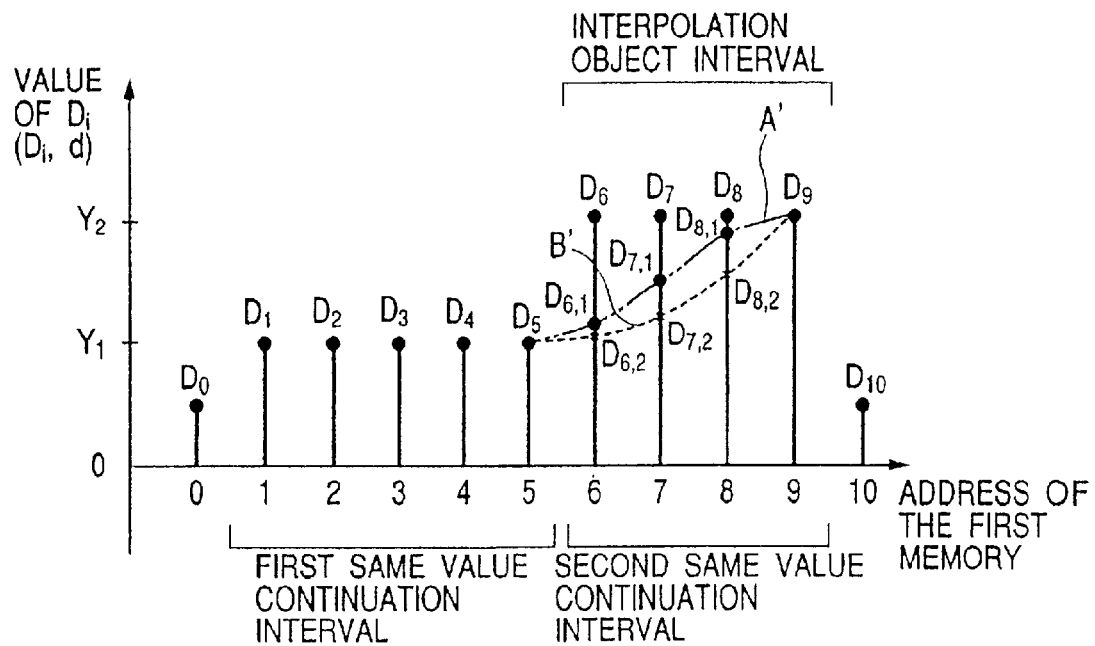
FIGS. 16A and 16B are diagrams showing another embodiment of interpolating operation by a curve.
Figure 16B:
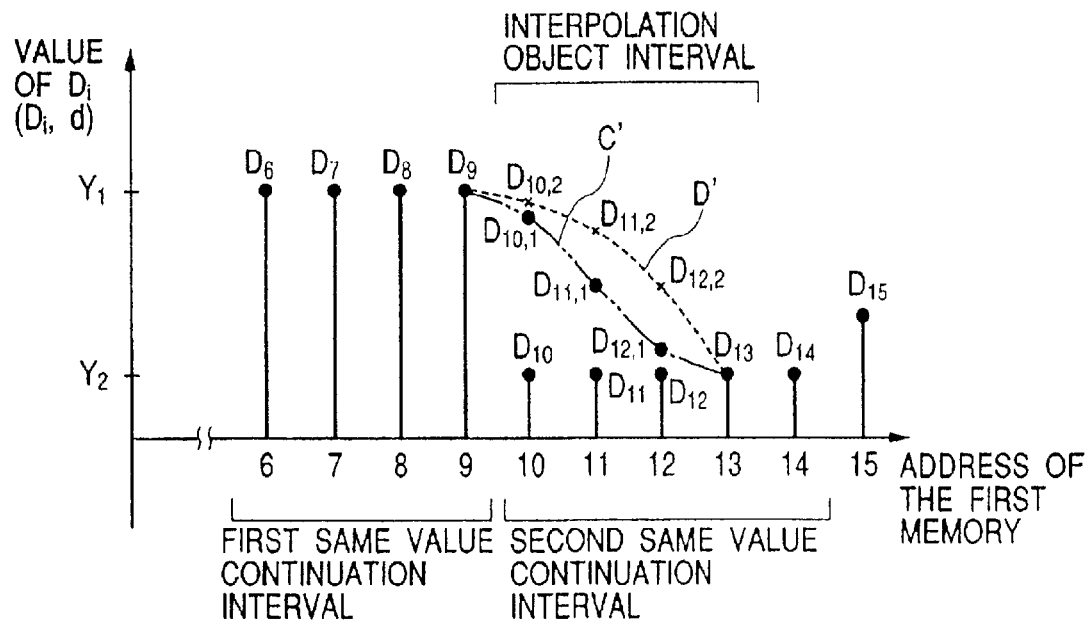

Thus, the embodiment described above makes an interval as the interpolation object interval, the interval which is determined by making the start of the leading same value continuation interval as the starting point and making the start of the following same value continuation interval as the end point when there exist two same value continuation intervals adjacent to each other. Against this, it is possible to make an interval as the interpolation object interval, the interval which is determined by making the end of the leading same value continuation interval as the starting point and making the end of the following same value continuation interval as the end point, and also in this case, the object desired can be achieved. Such a state that a signal level changes before and after the interpolation operation in this case is shown in FIG. 16.

Embodiment of Interpolation Processing by DSP

In an interpolation method of the present invention, it is possible to perform real time processing by executing a program by using a digital signal processor (DSP) that is a microcomputer dedicated to signal processing.

FIG. 1 is a block diagram showing the structure of an interpolation apparatus embodying an interpolation method according to the present invention.

Figure 2:
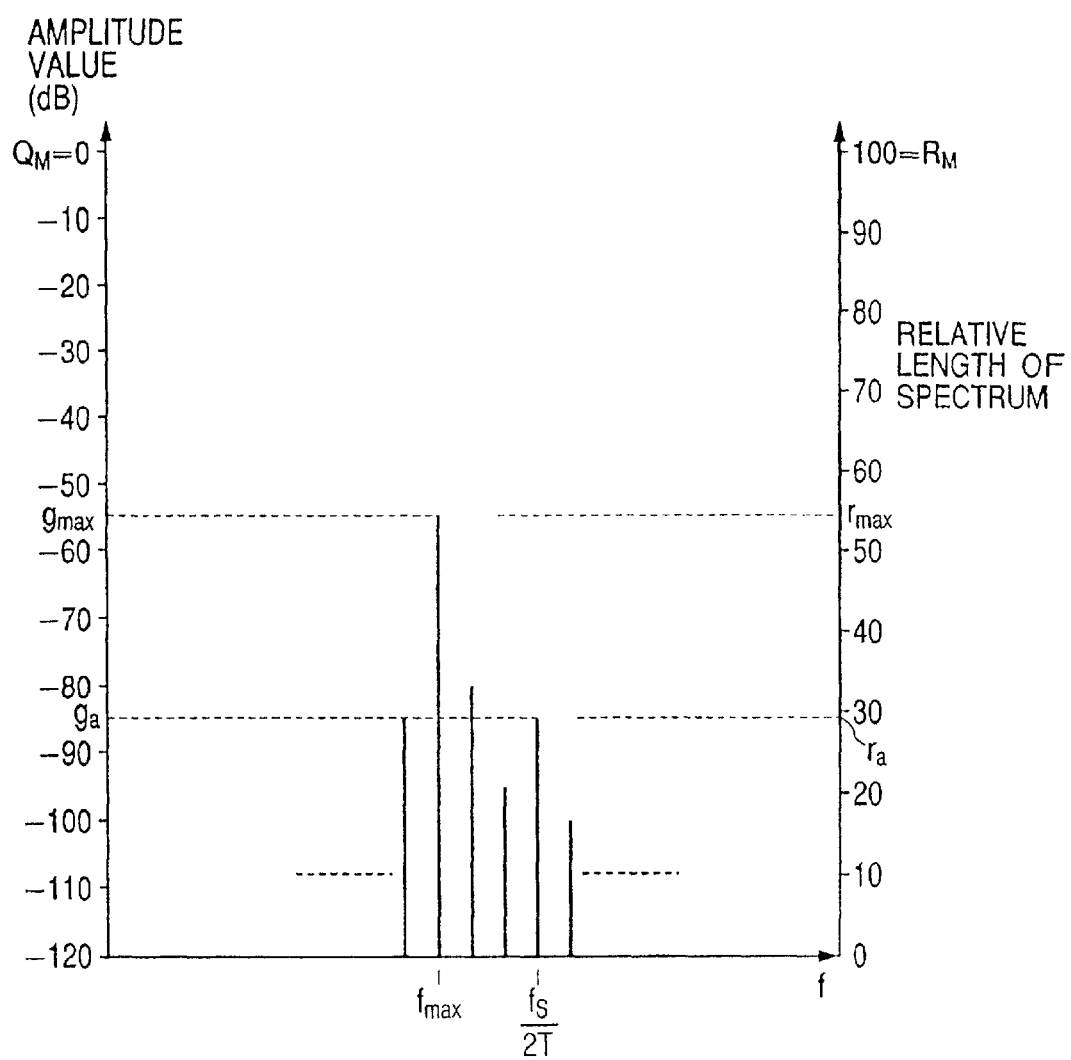
FIG. 2 is a frequency spectral map showing a result of FFT processing that a DSP (Digital Signal Processor) in FIG. 1 performs.

Reference character 1 denotes an input terminal for digital data after decompression of compressed voice data, and here, it is assumed that a series of digital data $d_0, d_1, d_2, \ldots$ is inputted, the series of digital data which is sampled with a sampling frequency $f_s$, has quantization bit length n, and is expressed in the notation of two's complement. Reference character 2A denotes first memory, which has capacity capable of storing (N+1) digital data in quantization bit length n'=(n+m) bits in address 0 to address N. Reference character 2B denotes second memory having M memory regions composed of the first memory region to the Mth memory region, each memory region which stores by using a DSP (digital signal processor) described later amplitude every frequency (as shown in FIG. 2, an amplitude value in a range of 0 to −120(dB) (in addition, let the amplitude value 0 dB be $Q_M$), and relative spectrum length if it is defined that the spectrum length of the amplitude value 0 db is $R_M=100$ on a scale whose origin is −120(dB) and which is divided by 10 dB to 0 dB) obtained from frequency component analysis by using FFT (measurement of frequency spectra) for the series of 512 digital data $d_i, d_{i+1}, d_{i+2}, \ldots, d_{i+511}$ that are continuous in the first memory, with associating with an address range $C_1$ to $C_2$ where the result of the FFT analysis can be used in the first memory. An address range where data used for a first FFT processing is stored is 0 to 511, and hence $C_1=0$ and $C_2=383$. An address range where data used for a second FFT processing is stored is 256 to 767, and hence $C_1=384$ and $C_2=639$. An address range where data used for a third FFT processing is stored is 512 to 1023, and hence $C_1=640$ and $C_2=895$ (see FIG. 8). Hereinafter, similarly, an address range where data used for a j≧4 FFT processing is stored is (j−1)×256 to (j−1)×256+511, and hence $C_1=(j-2)\times 256+384$ and $C_2=(j-2)\times 256+639$. In addition, here, for convenience, it is assumed that N and M are sufficiently large.

Reference character 3 denotes a DSP, which receives a series of digital data $d_0, d_1, d_2, \ldots$ from an input terminal 1 and writes the series in the first memory 2A with extending them by m bits toward the low-order side in an input order (concretely, in case of the notation of two's complement, m digits of 0's are added to the low-order side of $d_i$ if the MSB that is a sign binary digit of $d_i$ is 0, and m digits of 1's are added to the low-order side of $d_i$ if the MSB that is the sign binary digit of $d_i$ is 1). Although a waveform of a series of digital data whose quantization bit length is extended in n'=(n+m) bits changes stepwise and has quantization noise, the DSP 3 performs predetermined interpolation processing of data stored in the first memory 2A to reduce the quantization noise. The DSP 3 reads data after interpolation from the first memory 2A in order in parallel to these writing to the first memory 2A and interpolation processing, and outputs the data from an output terminal 4 as a series of digital data $G_0, G_1, G_2, \ldots$, which is sampled by the sampling frequency $f_s$ and has quantization bit length n'=(n+m) bits.

A. Curve Interpolation

Figure 3:
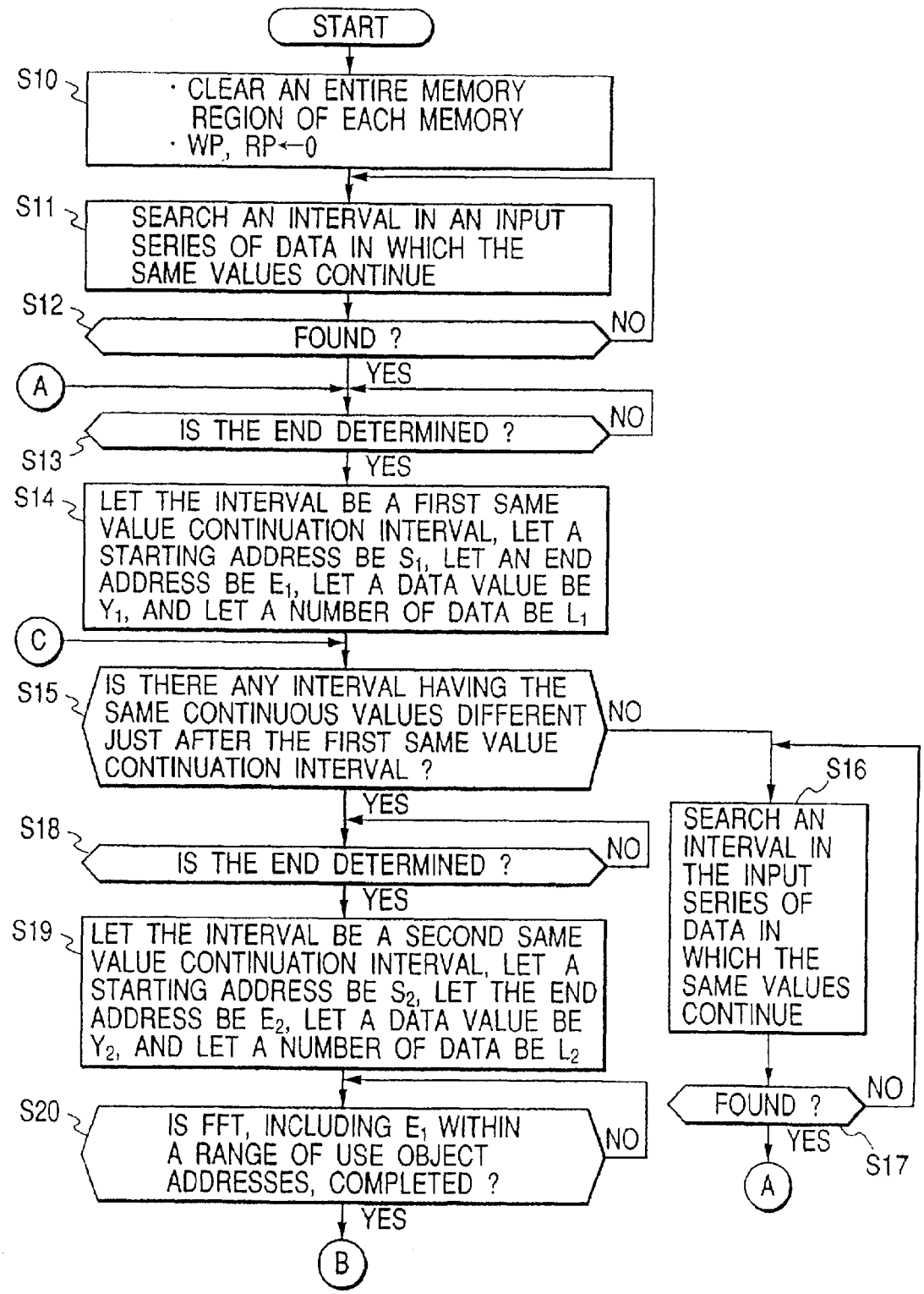
FIG. 3 is a flow chart showing the main processing of the DSP (Digital Signal Processor) in FIG. 1.
Figure 4:
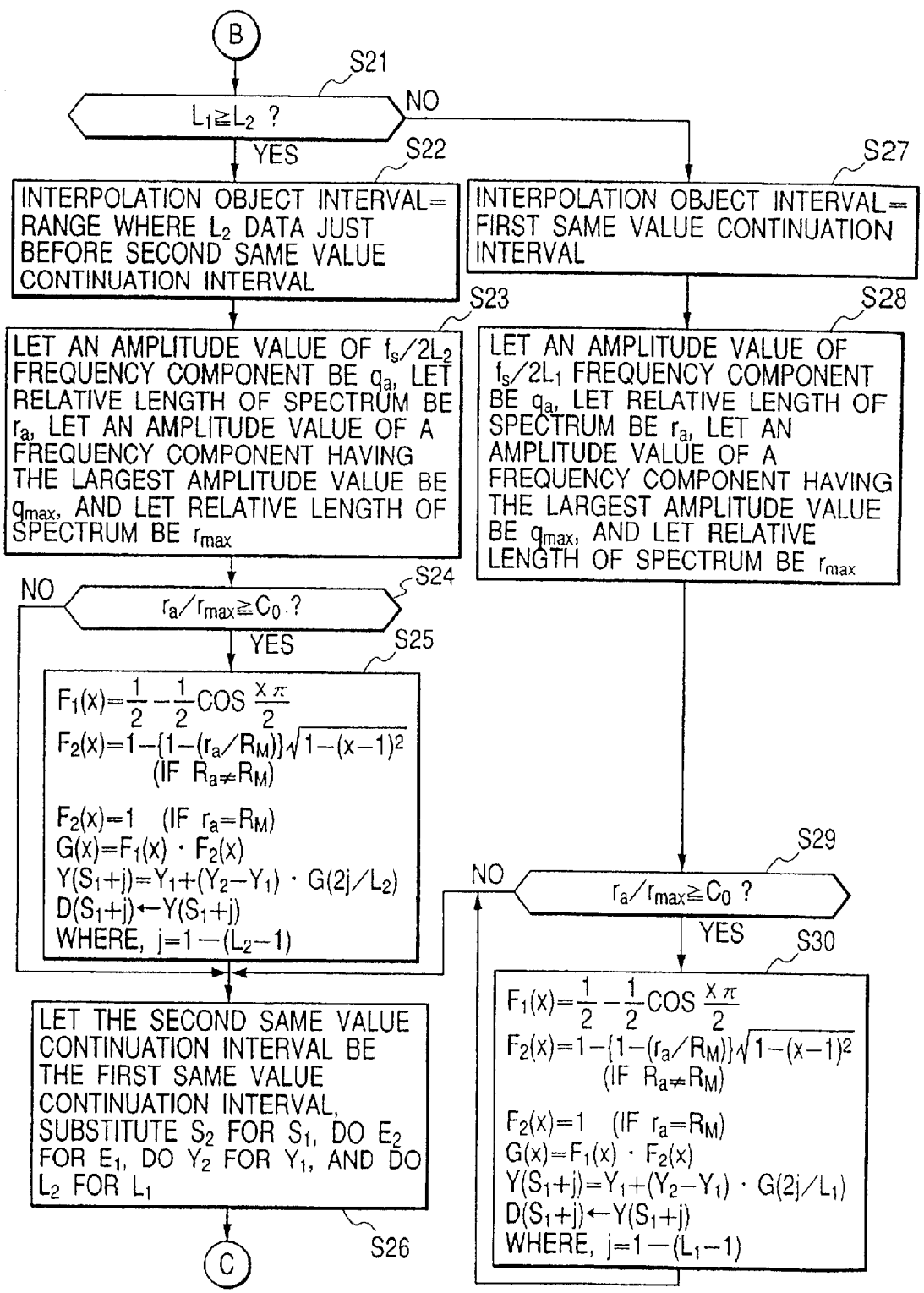
FIG. 4 is a flow chart showing the main processing of the DSP in FIG. 1.
Figure 5:
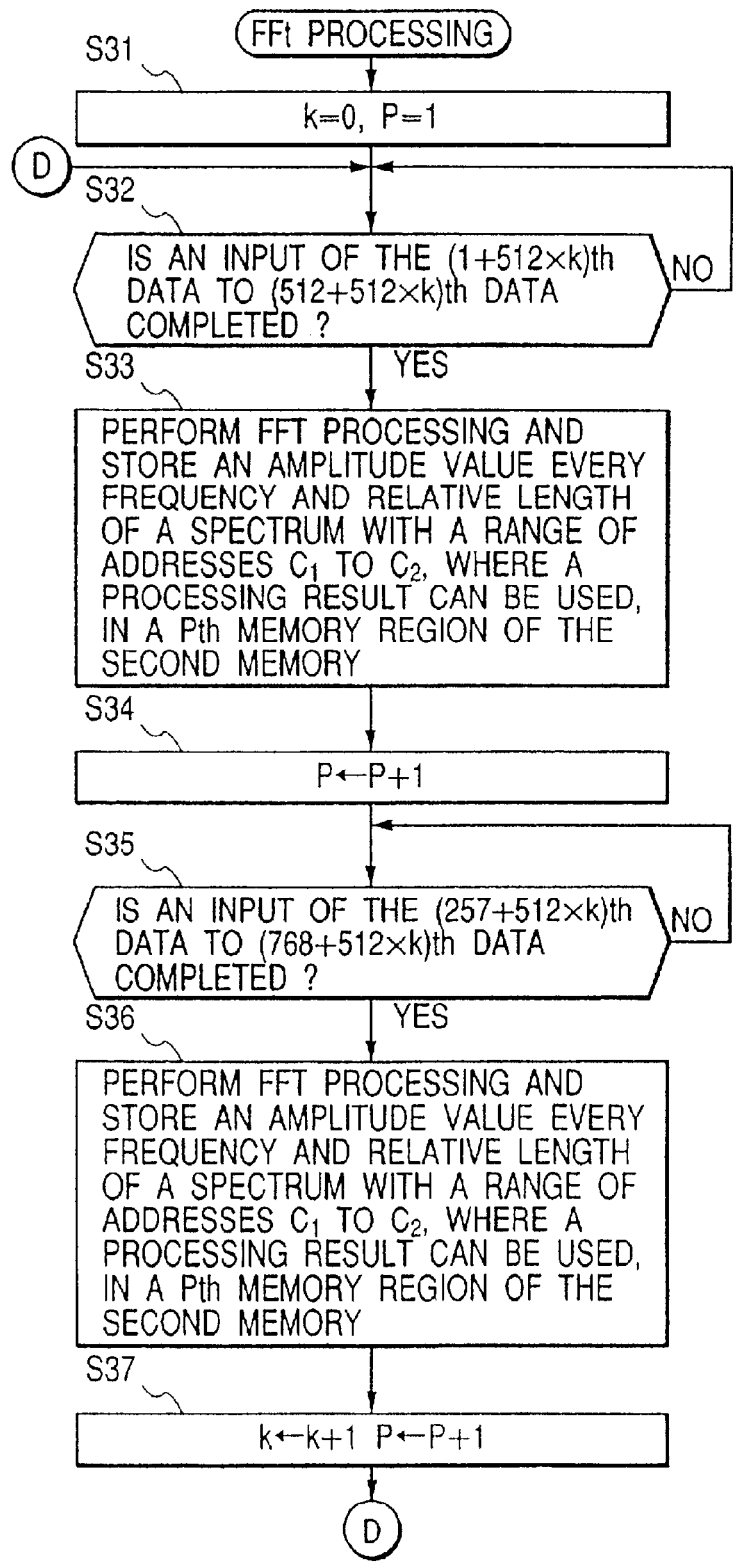
FIG. 5 is a flow chart showing the FFT processing of the DSP in FIG. 1.
Figure 6:
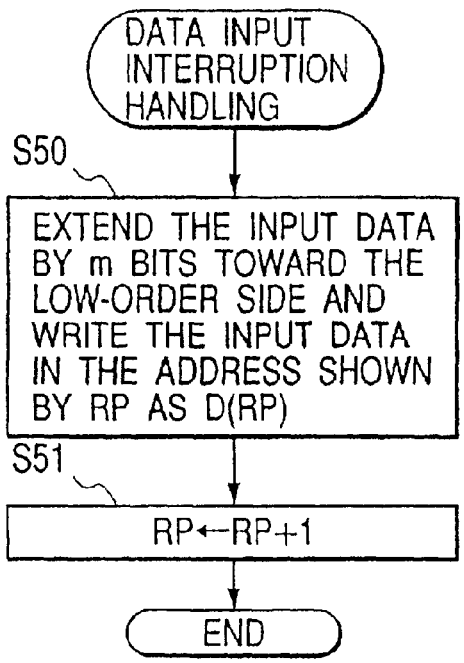
FIG. 6 is a flow chart showing the data input processing of the DSP in FIG. 1.
Figure 7:
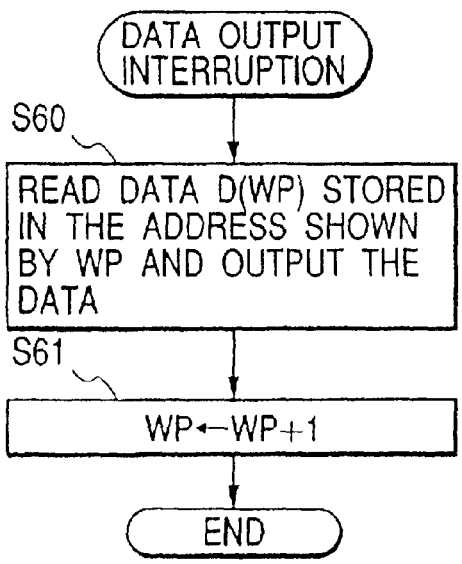
FIG. 7 is a flow chart showing the data output processing of the DSP in FIG. 1.
Figure 8A:
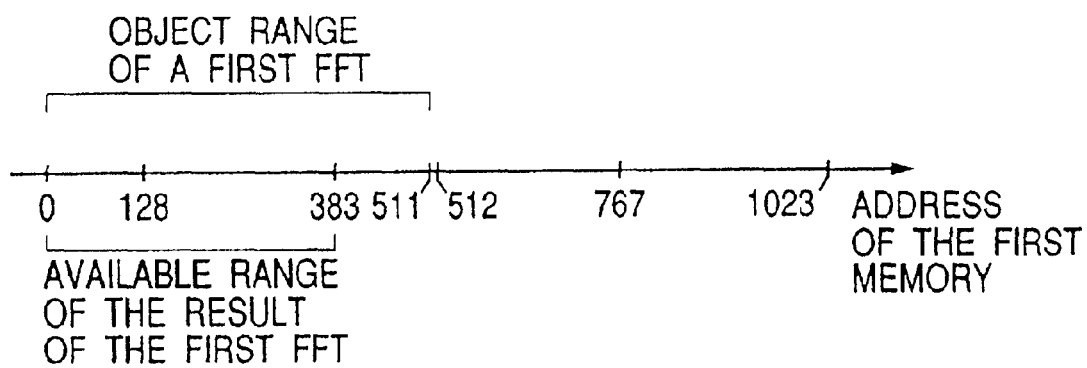
FIGS. 8A–8C are explanatory diagrams showing the FFT operation of the DSP in FIG. 1.
Figure 8B:
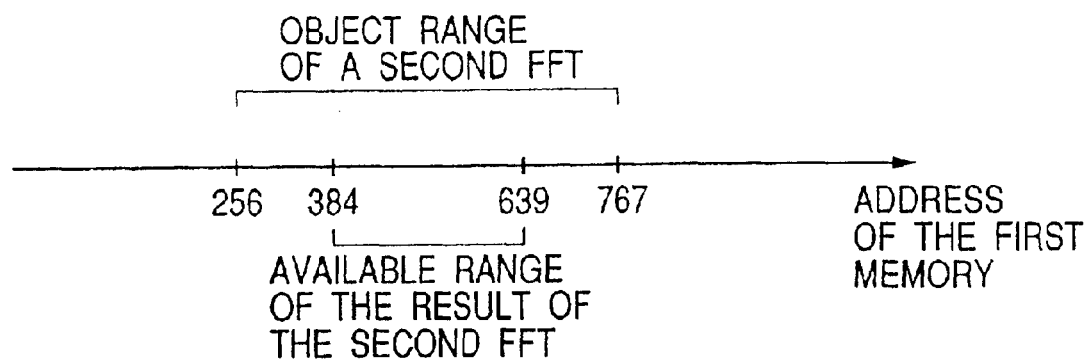
Figure 8C:
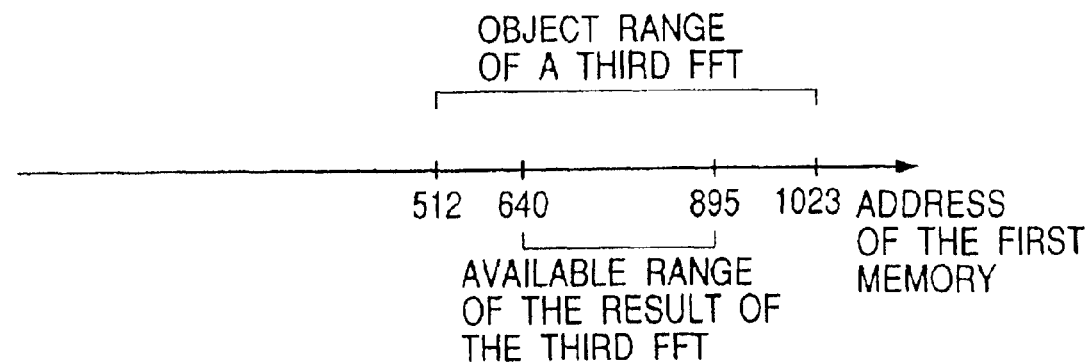
Figure 9A:
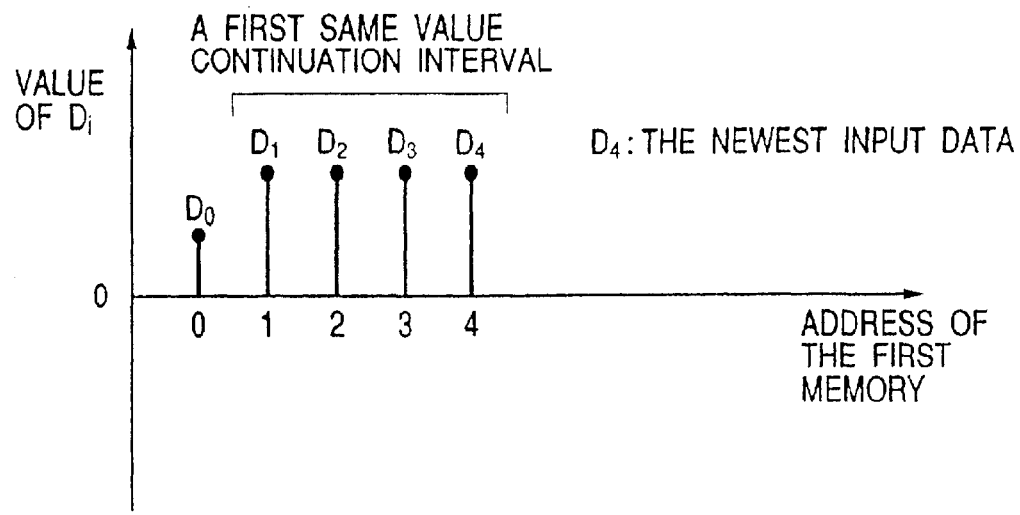
FIGS. 9A and 9B are diagrams showing an embodiment of interpolating operation by a curve.
Figure 9B:
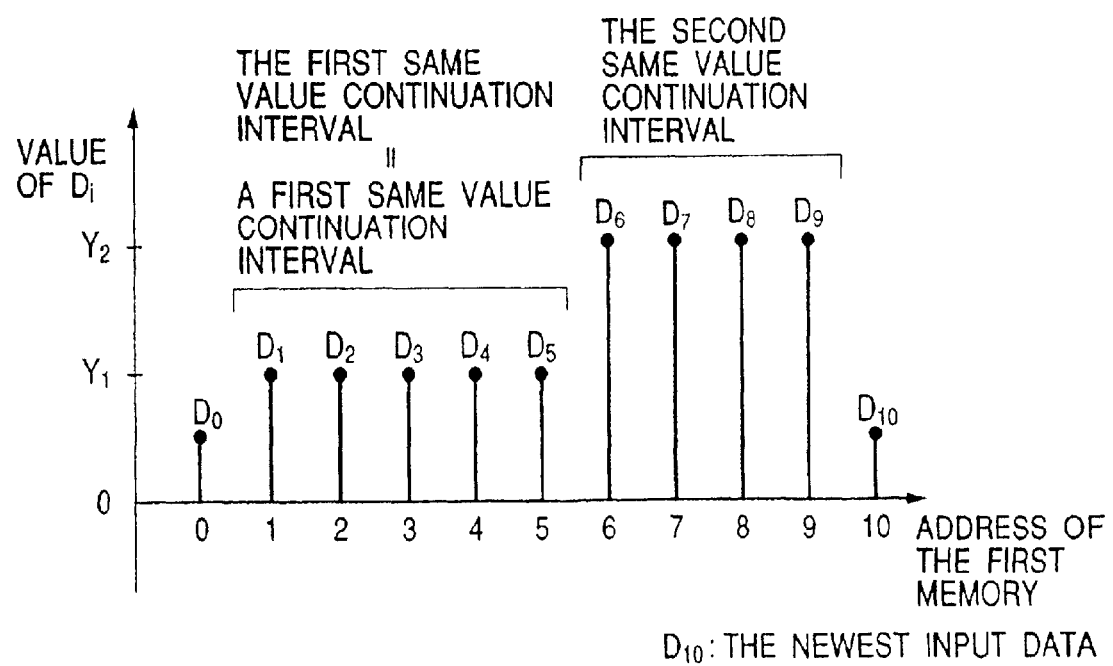

FIGS. 3 and 4 are flow charts showing the main processing of the DSP 3, FIG. 5 is a flow chart showing FFT processing executed by the multitask processing of the DSP 3 in parallel to the main processing, FIG. 6 is a flow chart showing data input interruption handling by the DSP 3, and FIG. 7 is a flow chart showing data output interruption handling by the DSP 3. FIG. 8 is an explanatory diagram of FFT operation by the DSP, FIGS. 9 and 10 are explanatory diagrams showing an example of series of data stored in the first memory 2A, and hereinafter, interpolating operation will be described with reference to these drawings. Here, assuming that n=8 and m=4, description will be performed. In addition, it is assumed that data stored in an address i of the first memory 2A are expressed as $D_i, D_i', D(i), D_{i,d}$ (d: an arbitrary integer), $D_{i,d}$. In addition, it is assumed that the possible maximum value of amplitude values every frequency that are obtained with frequency analysis by using FFT is $Q_M=0$ dB and spectrum length of the amplitude value 0 dB is $R_M=100$ (see FIG. 2).

First, the DSP 3 not only clears all the regions of the first memory 2A and second memory 2B by means of initialization, but also makes a write pointer RP and a read pointer WP to the first memory 2A be 0 (step S10 in FIG. 3). Subsequently, the DPS 3 executes the data input interruption handling, shown in FIG. 6, each time new digital data $d_i$ (i=0, 1, 2, . . . ) with bit length n=8 is inputted into the input terminal 1, and not only writes the digital data in an address shown by RP in the first memory 2A with extending the digital data by m=4 bits toward the low-order side, but also performs increment processing of RP (steps S50 and S51; see FIG. 9). In addition, after the number of input data exceeds 1024, the DSP 3 performs data output interruption handling, shown in FIG. 7, in a period $T_o=(1/f_s)$, reads data D(WP) from an address shown by WP in the first memory 2A to output the data as $G_{WP}$, and increments WP (steps S60 and S61).

After the initialization, the DSP 3 refers to the first memory 2A from the starting address side and searches whether an interval where a plurality of same value data continue exists in the input series of data (steps S11 and S12 in FIG. 3). When finding a first same value continuation interval (YES at step S12), the DSP 3 subsequently checks whether the end of the same value continuation interval is determined (step S13). The DSP 3 judges that the end is not determined if the newest input data corresponds to the end of the same value continuation interval found this time (see $D_4$ in FIG. 9(1)), and in this case, the DSP 3 waits for the end being determined with a subsequent data input. Differently from this, if data having a value different from that in the same value continuation interval is stored just after the same value continuation interval found this time (see $D_5$ in FIG. 9(2)), the DSP 3 judges that the end of the same value continuation interval is determined.

If judgment is YES at step S13, the DSP 3 makes the same value continuation interval, found this time, as a first same value continuation interval, and stores its starting address, end address, data value, and a number of data as $S_1$, $E_1$, $Y_1$, and $L_1$ respectively (step S14). In FIG. 9(2), $S_1=1$, $E_1=5$, and $L_1=5$. Next, the DSP 3 refers to the first memory 2A and checks whether a same value continuation interval having values different from those in the first same value continuation interval exists just after the first same value continuation interval (step S15). If it does not exist, the DSP 3 refers to the first memory 2A and searches a next same value continuation interval in the input series of data (steps S16 and S17), and if the same value continuation interval is found, the process goes to the step S13 for the DSP 3 to perform the same processing as described above.

Here, assuming that, as shown in FIG. 9(2), a same value continuation interval having values different from those in the first same value continuation interval, exists just after the first same value continuation interval, the DSP 3 subsequently checks whether the end of the same value continuation interval is determined (step S18). The DSP 3 judges that the end is not determined if the newest input data corresponds to the end of the same value continuation interval, and the DSP 3 waits for the end being determined with a subsequent data input, but, if data having values different from those in the same value continuation interval is stored just after the same value continuation interval (see $D_{10}$ in FIG. 9(2)), the DSP 3 judges that the end of the same value continuation interval is determined as the second same value continuation interval, and the DSP 3 stores its starting address, end address, data value, and a number of data as $S_2$, $E_2$, $Y_2$, and $L_2$ respectively (step S19). In FIG. 9(2), $S_2=6$, $E_2=9$, and $L_2=4$.

Next, as described later in detail, the DSP 3 determines all of the first same value continuation interval or part of the first same value continuation interval just before the second same value continuation interval as an interpolation object interval, and hence the DSP 3 refers to the second memory 2B, checks whether FFT, including the end address $E_1$ of the first same value continuation interval in the object address range $C_1$ to $C_2$ where the result of the FFT can be used, is completed, and if not, the DSP 3 waits for completion (step S20).

The DSP 3 performs the FFT processing, shown in FIG. 5, in parallel to main processing, shown in FIGS. 3 and 4, by using multitask processing. In FIG. 5, first, with letting k, determining a range of data used for the FFT processing in the first memory 2A, be 0, and letting P, determining a memory region where the result of the FFT processing is stored in the second memory 2B, be 1 (step S31), the DSP 3 waits for the first to 512th data $d_0$, $d_1$, ..., $d_{511}$ being inputted from the input terminal 1 and stored into the first memory 2A (step S32). If judgment is YES at the step S32, the DSP 3 performs the FFT processing by using these first to 512th data, obtains the amplitude of components (amplitude values and relative length of a spectrum; see FIG. 2) every frequency, and not only stores the amplitude in a first memory region of the second memory 2B, but also stores the address range $C_1$ to $C_2$, where the result of the FFT processing performed this time can be used, out of the first memory 2A in the first region (step S33). As shown in FIG. 8(1), in case of the first FFT, it is made that $C_1=0$ and $C_2=383$. In addition, it is assumed that one cycle of FFT processing is completed within the time ($=256\times(1/f_s)$) necessary for inputting 256 data $d_i$.

After the step S33, the DSP 3 increments P to 2 (step S34) and waits for the 255th to 767th data being inputted from the input terminal 1 and stored into the first memory 2A (step S35). If judgment is YES at the step S35, the DSP 3 performs the FFT processing by using these 255th to 767th data, obtains amplitude values every frequency and relative length of a spectrum, and not only stores them into a second memory region of the second memory 2B, but also stores the address range $C_1$ to $C_2$, where the result of the FFT processing obtained this time can be used, out of the first memory 2A in the second memory region (step S36). As shown in FIG. 8(2), in case of the second FFT, it is made that $C_1=384$ and $C_2=639$.

After the step S36, the DSP 3 increments k to 1, and increments P to 3 (step S37). Then, the DSP 3 waits for the 513th to 1024th data being inputted from the input terminal 1 and stored into the first memory 2A (step S32). If judgment is YES at the step S32, the DSP 3 performs the FFT processing by using these 513th to 1024th data, obtains amplitude values every frequency and relative length of a spectrum, and not only stores them into a third memory region of the second memory 2B, but also stores the address range $C_1$ to $C_2$, where the result of the FFT processing obtained this time can be used, out of the first memory 2A in the third memory region (step S33). As shown in FIG. 8(3), in case of the third FFT, it is made that $C_1=640$ and $C_2=895$.

Hereinafter, the DSP 3 repeats similar processing, analyzes frequency components by means of the FFT processing by using data in a certain period out of the input series of data, and obtains amplitude values every frequency and relative length of a spectrum.

If judgment is YES at the step S20 during main processing shown in FIGS. 3 and 4 in process of the FFT processing described above, the DSP 3 compares $L_1$ with $L_2$ (step S21 in FIG. 4), and if $L_1 \geq L_2$, the DSP 3 determines a range, where $L_2$ data just before the second same value continuation interval out of the first same value continuation interval exists, as the interpolation object interval (step S22). If $L_1<L_2$, the DSP 3 determines the entire first same value continuation interval as the interpolation object interval (step S27).

In the case of FIG. 9(2), since judgment becomes YES at step S21, the DSP 3 refers to the amplitude values every frequency and relative spectrum length, stored in the memory region (here, the first memory region) including the address E, out of the second memory 2B in the address range $C_1$ to $C_2$, where the result of frequency component analysis with the FFT can be used after executing the processing at the step S22, and lets the time length of the interpolation object interval be T, lets the amplitude value in the frequency ½T=$f_s$/2$L_2$ be $q_a$, lets the relative length of a spectrum be $r_a$, lets the amplitude value in the frequency $f_{max}$, the value of which is the largest, be $q_{max}$, and lets the relative length of its spectrum be $r_{max}$ (step S23; see FIG. 2). Then, the DSP 3 checks whether $r_a/r_{max}$ is equal to or more than a predetermined reference value $C_0$ (step S24). Since the influence of an error caused by noise becomes large if $r_a/r_{max}$ is less than $C_0$, accurate interpolation cannot be performed, and hence the interpolation processing in the interpolation object interval found this time is not performed. If judgment is YES at the step S24, the DSP 3 performs interpolation processing in the interpolation object interval, found this time, by replacing values of digital data in the interpolation object interval in the first memory 2A according to an interpolation function whose values monotonously change from the start of the interpolation object interval to the start of the second same value continuation interval (step S25).

If judgment is YES at the step S21 and YES at the step S24, the DSP 3 performs interpolation in the interpolation object interval found this time by replacing the data $D(S_1+j)$ in the address $(S_1+j)$ in the first memory 2A with $Y(S_1+j)$ (step S25). In FIG. 10(1), D(3), D(4), and D(5) are replaced.

After the step S25, the DSP 3 replaces $S_1$ with $S_2$, $E_1$ with $E_2$, $Y_1$ with $Y_2$, and $L_1$, with $L_2$, makes the second same value continuation interval, found this time, as a new first same value continuation interval (step S26), and returns to step S15 in FIG. 3. At the step S15, the DSP 3 refers to the first memory 2A, checks whether a same value continuation interval having values different from those in the first same value continuation interval, exists just after the first same value continuation interval, and if does not exist, the DSP 3 refers to the first memory 2A, and searches a next same value continuation interval in the input series of digital data (steps S16 and S17), and if the same value continuation interval is found, the process goes to step S13 for the DSP 3 to perform the same processing as described above.

Here, if another same value continuation interval having values different from those in the first same value continuation interval, exists just after the first same value continuation interval from the address $S_1$=6 to $E_1$=9 as shown in FIG. 10(2), the DSP 3 subsequently checks whether the end of the other same value continuation interval is determined (step S18). The DSP 3 judges that the end is not determined if the newest input data corresponds to the end of the same value continuation interval, and the DSP 3 waits for the end being determined with a subsequent data input, but, if data having values different from those in the other same value continuation interval that is equal is stored just after the other same value continuation interval, the DSP 3 judges that the end of the other same value continuation interval is determined (see FIG. 10(2)), and the DSP 3 makes the other same value continuation interval as the second same value continuation interval and stores its starting address, end address, data value, and a number of data as $S_2$, $E_2$, $Y_2$, and $L_2$ respectively (step S19). In FIG. 10(2), $S_2$=10, $E_2$=14, and $L_2$=5.

Next, the DSP 3 checks whether the FFT is completed, the FFT including the end address $E_1$=9 of the first same value continuation interval in the address range $C_1$ to $C_2$, where the result of frequency component analysis with FFT processing can be used, and if judgment is YES here, the process goes to step S21 in FIG. 4. At the step S21, the DSP 3 compares $L_1$ and $L_2$, and since $L_1$<$L_2$ this time, the DSP 3 determines the entire first same value continuation interval as the interpolation object interval (step S27). Since same value continuation intervals, which are similar to the first same value continuation interval, periodically appear frequently in the input series of digital data, the DSP 3 makes a sinusoidal wave component of an interpolation waveform in the interpolation object interval be suitable to a frequency component, which a signal waveform of the series of digital data before the interpolation has in a predetermined interval covering intervals before and after the first same value continuation interval by making the time length of the interpolation object interval be the same as that in the first same value continuation interval if $L_1$<$L_2$. Owing to this, it is possible to reduce the quantization noise without a feeling of strangeness by preventing a frequency component from being excessively emphasized from the viewpoint of frequency components that the series of digital data before the interpolation has before and after the first same value continuation interval. Furthermore, since a low pass filter is not used, the group delay frequency characteristic never becomes worse.

The DSP 3 refers to amplitude values every frequency stored in the first memory region including the address $E_1$ in the address range $C_1$ to $C_2$, where the result of frequency component analysis can be used with the FFT processing, out of the second memory 2B, lets an amplitude value in the frequency component with $f_s$/2$L_1$ be $q_a$, lets relative length of a spectrum be $r_a$, lets an amplitude value in the frequency $f_{max}$, the value of which is the largest, be $q_{max}$, and lets the relative length of its spectrum be $r_{max}$ (step S28).

Then, the DSP 3 checks whether $r_a/r_{max}$ is equal to or more than a predetermined reference value $C_0$ (step S29). Since the influence of an error caused by noise becomes large if $r_a/r_{max}$ is less than $C_0$, the interpolation processing in the interpolation object interval found this time is not performed. If judgment is YES at the step S29, the DSP 3 performs interpolation processing in the interpolation object interval, found this time, by replacing values of digital data within the interpolation object interval in the first memory 2A according to an interpolation function whose values are adaptively changed according to the result of the frequency component analysis with the FFT near the interpolation object interval to the series of digital data before the interpolation so that the values may monotonously change from the start of the interpolation object interval to the start of the second same value continuation interval (step S30).

Concretely, if judgment is NO at the step S21 and YES at the step S29, the DSP 3 performs interpolation in the interpolation object interval, found this time, by letting the interpolation function $Y(S_1+j)$ (j: discrete variable) be:

$$Y(S_1+j)=Y_1+(Y_2-Y_1) \cdot G(2j/L_1)$$

where j=1, 2, ..., ($L_1$–1), and replacing the data $D(S_1+j)$ in the address $(S_1+j)$ in the first memory 2A with $Y(S_1+j)$ (step S30). In FIG. 10(2), D(7), D(8), and D(9) are replaced.

For example, if $r_a$=$R_M$, $F_2(x)$=1, and hence $G(x)$=$F_1(x)$.

After the step S30, the DSP 3 replaces $S_1$ with $S_2$, $E_1$ with $E_2$, $Y_1$ with $Y_2$, and $L_1$ with $L_2$, makes the second same value continuation interval, found this time, as a new first same value continuation interval (step S26), returns to the step S15 in FIG. 3, and subsequently repeats the similar processing.

The series of digital data $D_0$, $D_1$, $D_2$, ... with quantization bit length=n' bits after the interpolation that is stored in the first memory 2A is sequentially read at a period of 1/$f_s$ with the data output interruption handling shown in FIG. 7, and is outputted as the series of digital data $G_0, D_1, D_2, \ldots$.

Figure 14:
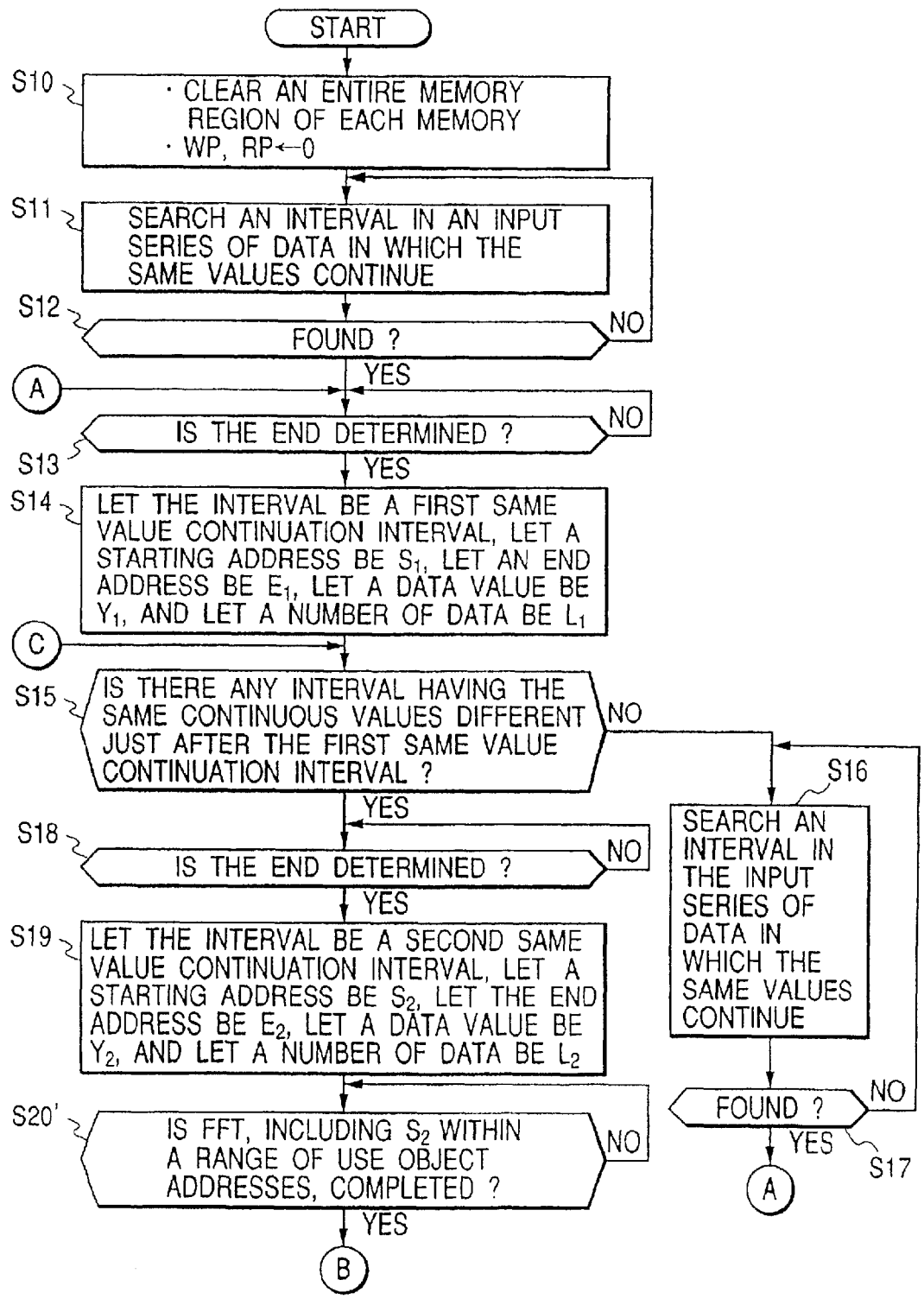
FIG. 14 is a flow chart showing the main processing of the DSP according to an example modified from that in FIG. 1.
Figure 15:
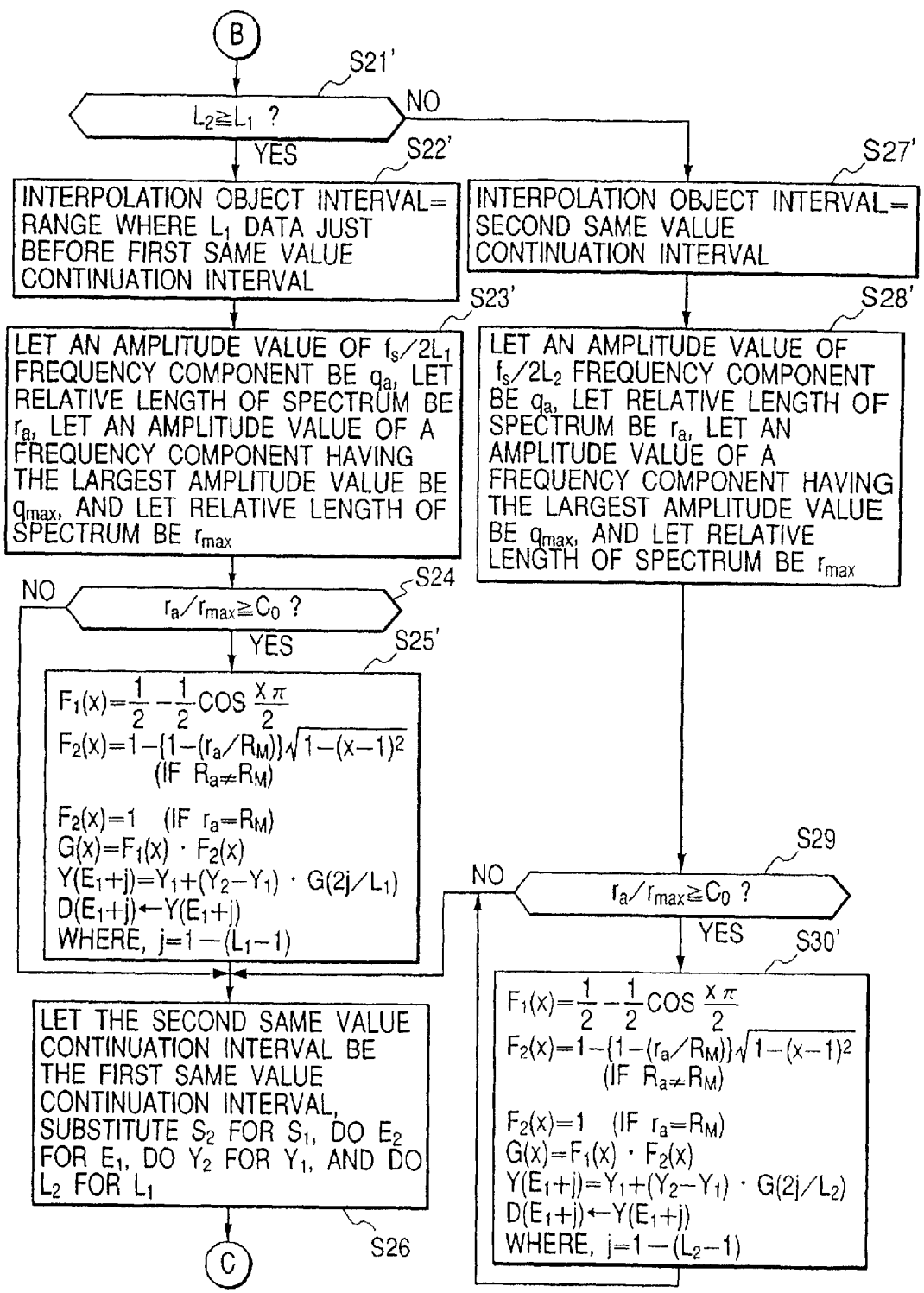
FIG. 15 is a flow chart showing the main processing of the DSP according to another example modified from that in FIG. 1.

In addition, although the embodiment described above sets an interpolation object interval, having the length same as that of the second same value continuation interval, in the first same value continuation interval between the first same value continuation interval and the second same value continuation interval, as a modified example, it can be performed to set an interpolation object interval, having the length same as that of the first same value continuation interval, in the second same value continuation interval. Concretely, the DSP 3 can perform the main processing shown in FIGS. 14 and 15 respectively instead of those in FIGS. 3 and 4 among the flow charts in FIGS. 3 to 7.

B. Linear Interpolation

In addition, although it is made in the embodiment and modified embodiment to perform the curve interpolation of an interpolation object interval in the first same value continuation interval or the second same value continuation interval, it can be made to perform linear interpolation.

Figure 17:
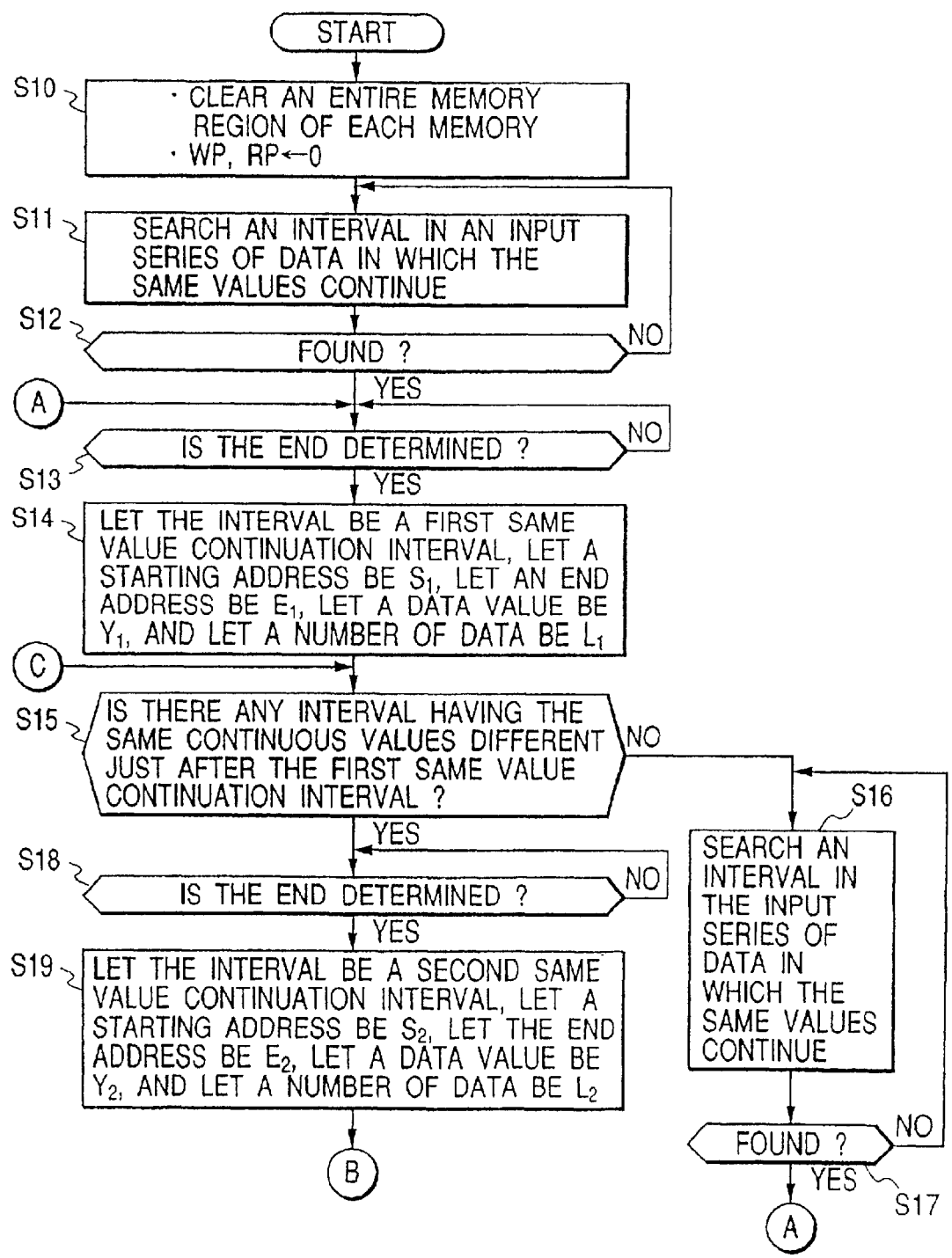
FIG. 17 is a flow chart showing the main processing of the DSP according to still another example modified from that in FIG. 1.
Figure 18:
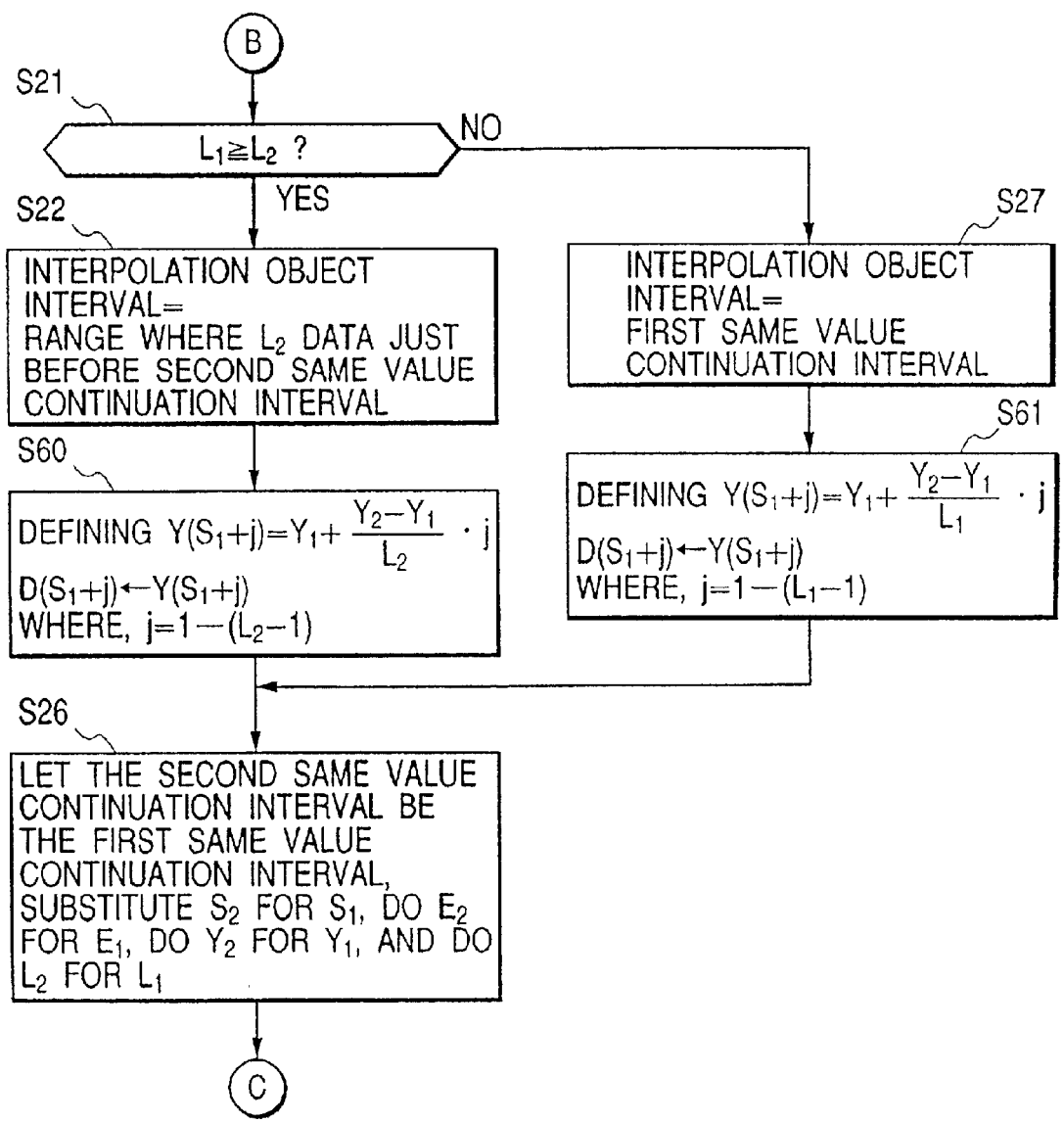
FIG. 18 is a flow chart showing the main processing of the DSP according to a still further example modified from that in FIG. 1.

Concretely, when performing the linear interpolation by setting an interpolation object interval in the first same value continuation interval, the DSP 3 can perform the main processing shown in FIGS. 17 and 18 respectively instead of those in FIGS. 3 and 4 among the flow charts in FIGS. 3 to 7.

Processing in FIGS. 17 and 18 will be simply described. Nevertheless, it is assumed that the input series of digital data $d_0, d_1, \ldots$ is the same as that in FIGS. 9 and 10. Quite similarly to steps S10 to S19 in FIG. 3, data $D_1$ to $D_5$ in addresses 1 to 5 in the first memory 12A is made to be a first same value continuation interval, and addresses 6 to 9 are made to be a second same value continuation interval (steps S10 to S19 in FIG. 17; see FIG. 19(1)).

Next, the DSP 3 compares $L_1$ with $L_2$ (step S21 in FIG. 18), and if $L_1 \geq L_2$, the DSP 3 determines a range, where $L_2$ data just before the second same value continuation interval out of the first same value continuation interval exists, as the interpolation object interval (step S22). If $L_1 < L_2$, the DSP 3 determines the entire first same value continuation interval as the interpolation object interval (step S27).

Figure 19A:
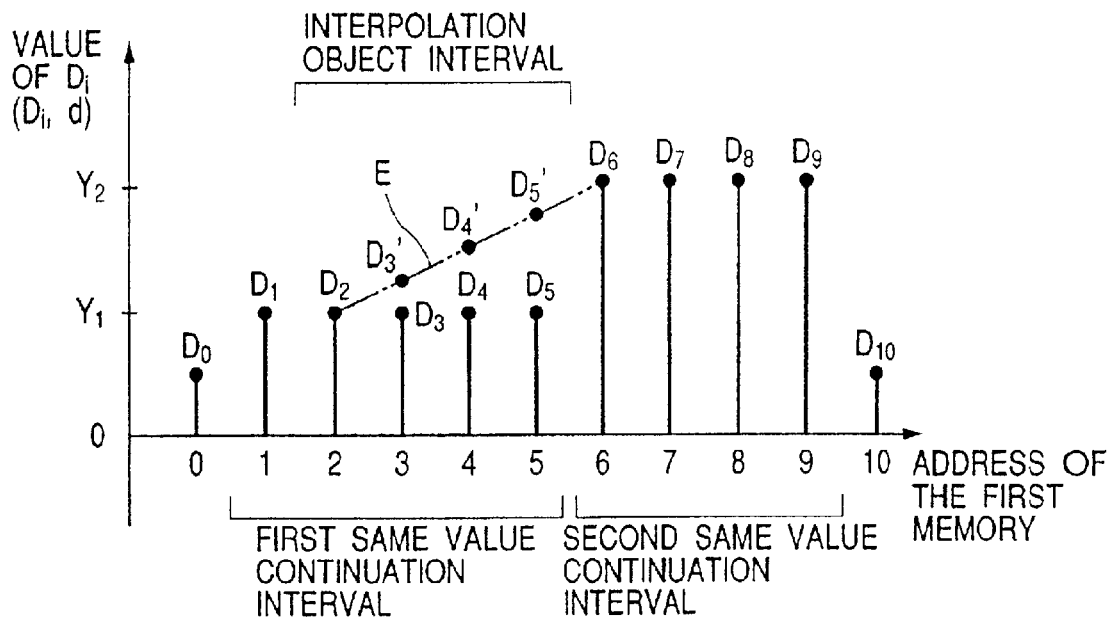
FIGS. 19A and 19B are diagrams showing an embodiment of 20 interpolating operation by a straight line.
Figure 19B:
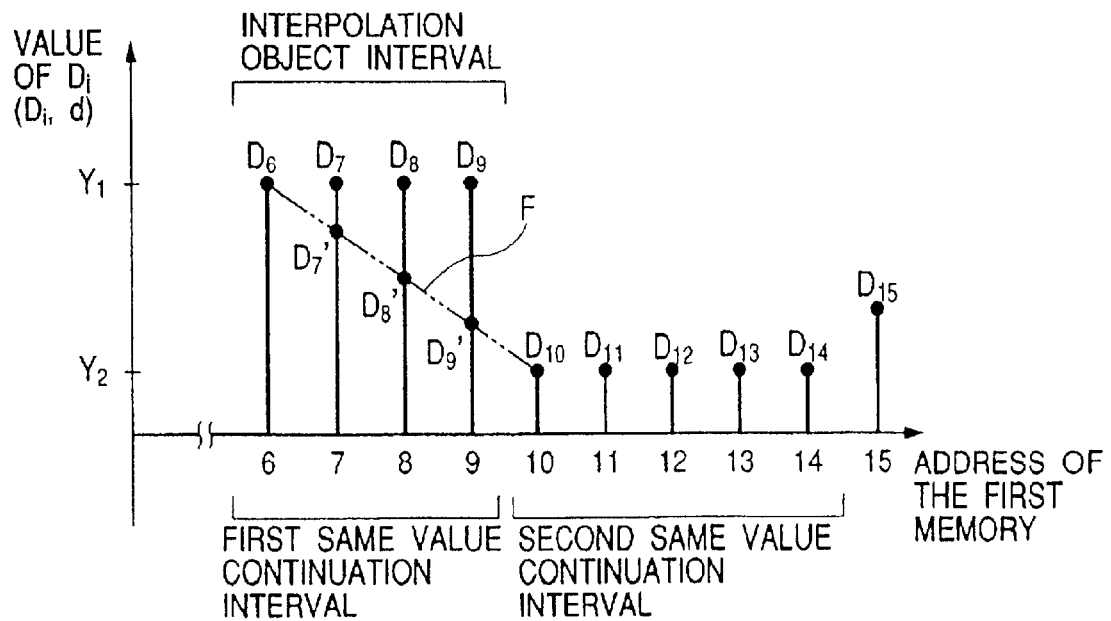

In FIG. 19(1), since judgment becomes YES at step S21, the DSP 3 performs interpolation processing by replacing values of digital data in the interpolation object interval in the first memory 2A according to an interpolation function whose values linearly change monotonously from the start of the interpolation object interval to the start of the second same value continuation interval (step S60) after executing the processing at the step S22.

Concretely, the DSP 3 performs the interpolation processing by letting an interpolation function $Y(S_1+j)$ which indicates the relationship between an address of respective data in the interpolation object interval $(S_1+j)$ and the value Y of respective data after interpolation (j: discrete variable; $S_1+j$ expresses an address in the first memory 2A) be:

$$Y(S_1+j)=Y_1+\{(Y_2-Y_1)/L_2\} \cdot j$$

where $j=1, 2, \ldots, (L_2-1)$, and replacing the data $D_3, D_4$, and $D_5$ in the addresses 3, 4, and 5 in the first memory 2A according to the following formula:

$$D(S_1+j) \rightarrow Y(S_1+j)$$

(see an interpolation straight line E and $D_3', D_4'$ and $D_5'$ in FIG. 19(1)).

After the step S60, the DSP 3 replaces $S_1$ with $S_2$, $E_1$ with $E_2$, $Y_1$ with $Y_2$, and $L_1$ with $L_2$, makes the second same value continuation interval, found this time, as a new first same value continuation interval (step S26), returns to the step S15 in FIG. 17. At the step S15, the DSP 3 refers to the first memory 2A and checks whether a same value continuation interval having values different from those in the first same value continuation interval exists just after the first same value continuation interval. If it does not exist, the DSP 3 refers to the first memory 2A and searches a next same value continuation interval in the input series of data (steps S16 and S17), and if the same value continuation interval is found, the process goes to the step S13 for the DSP 3 to perform the same processing as described above.

Here, assuming that, as shown in FIG. 19(2), another same value continuation interval having values different from those in the first same value continuation interval, exists just after the first same value continuation interval from the address $S_1=6$ to $E_1=9$, the DSP 3 subsequently checks whether the end of the other same value continuation interval is determined (step S18). If judgment is YES, the DSP 3 makes the other same value continuation interval as the second same value continuation interval, and stores its starting address, end address, data value, and a number of data as $S_2, E_2, Y_2$, and $L_2$ respectively (step S19). In FIG. 19(2), $S_2=10$, $E_2=14$, and $L_2=5$.

Next, the process goes to step S21 in FIG. 18. At the step S21, the DSP 3 compares $L_1$ and $L_2$, and since $L_1 < L_2$, the DSP 3 determines all the first same value continuation interval as the interpolation object interval (step S27). Since same value continuation intervals, which are similar to the first same value continuation interval, periodically appear frequently in the series of digital data before and after the first same value continuation interval, having large quantization noise, such as a music signal, the DSP 3 can make a sinusoidal wave component of an interpolation waveform in the interpolation object interval be suitable to a frequency component, which a signal waveform of the original series of digital data before the interpolation has in a predetermined interval covering intervals before and after the first same value continuation interval by making the time length of the interpolation object interval be the same as that in the first same value continuation interval, and hence, it is possible to effectively reduce the quantization noise by preventing a frequency component from being excessively emphasized from the viewpoint of frequency components that the original series of digital data has before and after the first same value continuation interval. Furthermore, since a low pass filter is not used, the group delay frequency characteristic never becomes worse.

Subsequently to the step S27, the DSP 3 performs the interpolation processing by replacing values of the digital data in the interpolation object interval in the first memory 2A according to an interpolation function whose values linearly change monotonously from the start of the interpolation object interval to the start of the second same value continuation interval (step S61).

Concretely, the DSP 3 performs the interpolation processing with letting an interpolation function $Y(S_1+j)$ which indicates the relationship between an address of respective data in the interpolation object interval $(S_1+j)$ and the value Y of respective data after interpolation (j: discrete variable; $S_1+j$ expresses an address in the first memory 2A) be:

$$Y(S_1+j)=Y_1+\{(Y_2-Y_1)/L_1\} \cdot j$$

where $j=1, 2, \ldots, (L_1-1)$, and replacing the data $D_7, D_8$, and $D_9$ in the addresses 7, 8, and 9 in the first memory 2A according to the following formula:

$$D(S_1+1) \leftarrow Y(S_1+j)$$

(see an interpolation straight line F and $D_7'$, $D_8'$ and $D_9'$ in FIG. 19(2)).

After the step S61, the DSP 3 replaces Si with $S_2$, $E_1$ with $E_2$, $Y_1$ with $Y_2$, and $L_1$ with $L_2$, makes the second same value continuation interval, found this time, as a new first same value continuation interval (step S26), returns to the step S15 in FIG. 17, and subsequently repeats the similar processing.

The series of digital data $D_0, D_1, D_2, \ldots$ with quantization bit length=n' bits after the interpolation that is stored in the first memory 2A is sequentially read at a period of $1/f_s$ with the data output interruption handling shown in FIG. 7, and is outputted as the series of digital data $G_0, D_1, D_2, \ldots$.

In addition, although the embodiments in FIGS. 17 and 18 perform linear interpolation by setting an interpolation object interval in the first same value continuation interval, it can be made to perform linear interpolation by setting an interpolation object interval in the second same value continuation interval similarly to the case of the curve interpolation.

Concretely, the DSP 3 can perform the main processing shown in FIGS. 17 and 20 respectively instead of those in FIGS. 3 and 4 among the flow charts in FIGS. 3 to 7.

In addition, although, in the embodiments and modified embodiments according to the curve interpolation and linear interpolation that are described above, description is performed with exemplifying n=8 and m=4, the present invention is never limited to these, but the present invention can be similarly applied even if n and m are other values such as n 16 and m=4, and n=20 and m=6. In addition, the present invention can be similarly applied also in case a series of data $d_0', d_1', d_2', \ldots$ after expanding $d_0, d_1, d_2, \ldots$ by m bits toward the low-order side is inputted into the input terminal and the DSP writes these data into the first memory as it is.

Processing of Digital Image Signal

Although the above-described description of an interpolation processing method of the present invention is performed with supposing a digital audio signal obtained by sampling and quantizing music sound or voice as a digital signal, the interpolation method of the present invention can also be applied to a digital image signal. Hereinafter, the interpolation processing of the digital image signal according to the present invention will be described.

Although the interpolation processing method of the present invention can also be applied to the digital image signal as it is, against the audio signal simply expressing time fluctuation of an instantaneous value of sound pressure, the image signal has such specificity that the image signal is accompanied by a two-dimensional visual spatiality.

Figure 25:
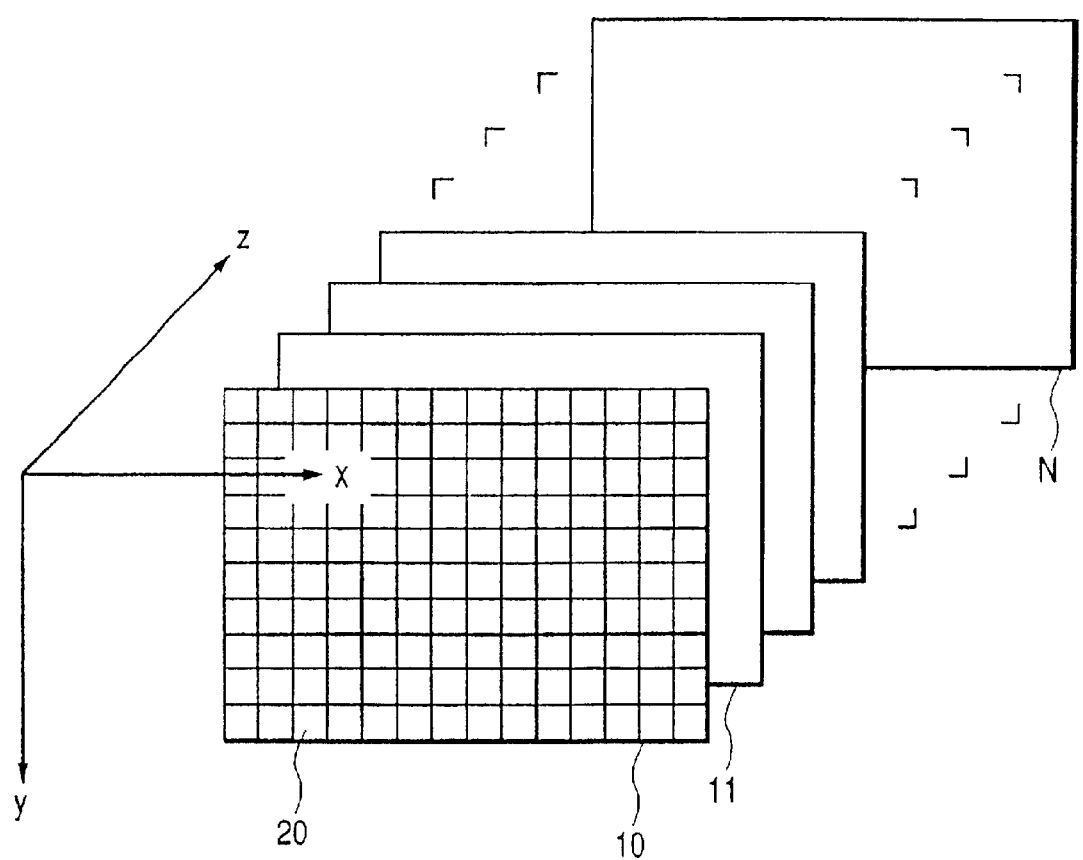
FIG. 25 is a graph showing the structure of image frames.

For example, a TV signal is a time series of luminance levels (in the case of color, time series of respective R, G, and B gradations) in essence, and this signal is scanned from the left to the right on the horizontal line of a screen, and is vertically scanned sequentially from the uppermost line to the next line downward. When one frame is completed, the scanning is moved to the next frame, similar horizontal/vertical scanning is repeated, and in consequence, an image is displayed. Therefore, when the digital image signal is processed, it is necessary to pay attention to the fluctuation of gradation levels in the horizontal and vertical direction in a frame and that in the interframe direction. FIG. 25 is a diagram showing a frame concept as property accompanied with such an image signal, reference character 10 denotes a current frame, reference character 11 denotes a frame immediately after the current frame, and reference character IN denotes a frame after N frame time passing. In addition, plenty of small partitions in the current frame represent pixels, and for example, reference character 20 denotes the third pixel from the left on the tenth line. Here, for convenience, it is assumed that the horizontal direction (line direction) in a frame is called the x direction, the vertical direction in the frame is the y direction, and the interframe direction is the z direction.

An object of image signal interpolation processing of the present invention is a compressed digital image signal such as an inter-frame differential signal, or an in-frame digitization cosine function transformation (DCT) signal. In the case of the former, difference of gradation levels of respective pixels between frames is the object of the interpolation processing, and in the case of the latter, each DCT coefficient obtained by blocking a frame and performing DCT transformation in each block is the object of the interpolation processing. Hereinafter, these are simply called gradation levels and DCT coefficients.

Figure 26A:
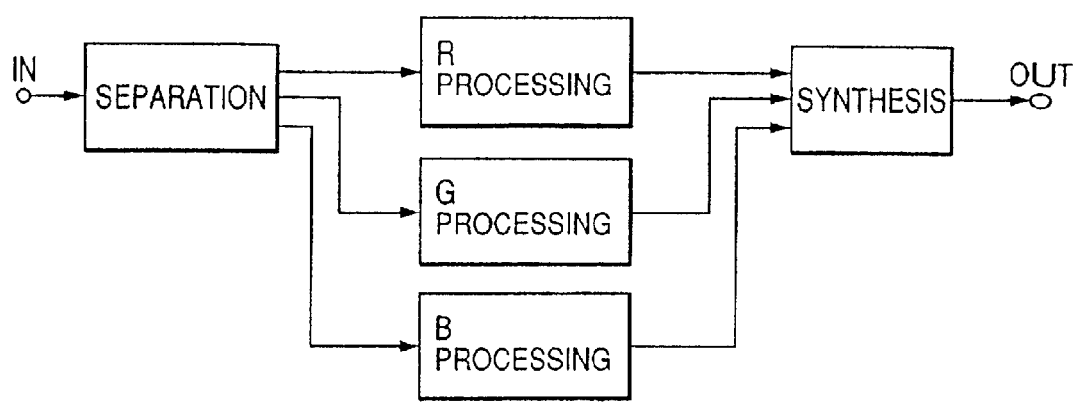
FIGS. 26A and 26B are fundamental block diagrams showing the preliminary treatment and interpolation processing of a digital image signal.
Figure 26B:
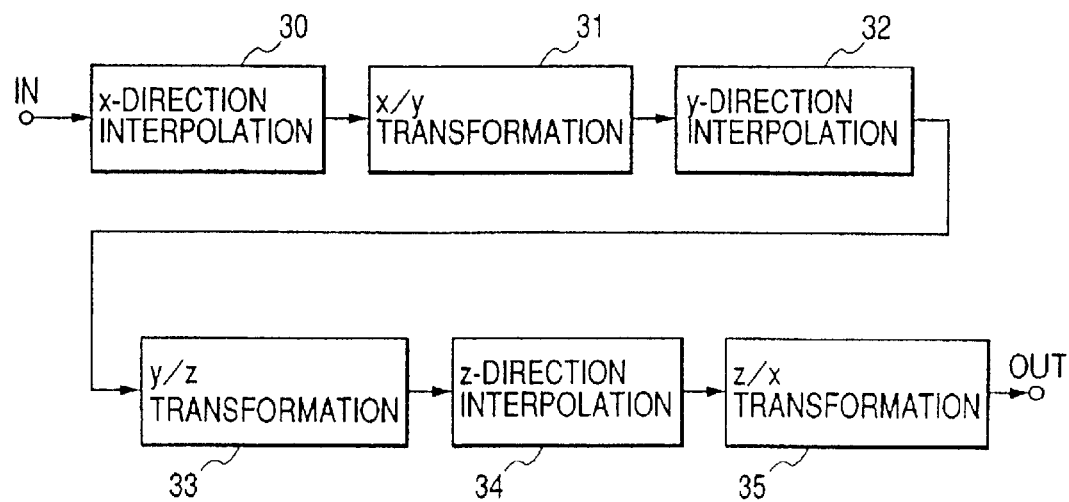

FIG. 26 is a diagram showing fundamental blocks for the interpolation processing of an image signal. It is assumed that, since the pixel signal includes gradation levels of three colors such as R, G, and B, first, this is separated, the interpolation processing is performed every color, these R, G, and B are synthesized after the interpolation processing, and an interpolated signal output is obtained (FIG. 26(1)).

In addition, if a pixel image signal is not composed of R, G, and B, but is composed of luminance (Y) and color difference (I, Q), the pixel signal is separated into Y, I, and Q, and the interpolation processing is performed for respective gradation levels of Y, I, and Q. The interpolation processing of respective R, G, and B is performed in the block structure shown in FIG. 26(2).

First, a given digital image signal (a series of gradation levels or DCT coefficients) is inputted into an x direction interpolation unit 30, and the interpolation processing in the x direction (the horizontal direction in a frame) is performed. Next, the series of levels in the x direction is transformed into a series of levels in the y direction by an x/y transformation unit 31, and the interpolation processing in the y direction (the vertical direction in the frame) is performed. After that, a series of levels in the z direction (the interframe direction) is obtained by a y/z transformation unit 33, the interpolation processing in the z direction (the interframe direction) is performed, and finally, z/x transformation is performed, and the digital image signal, the interpolation processing of which is completed in all of the x, y, and z directions, is obtained as an output to be provided to an application device such as a display device.

Figure 27A:
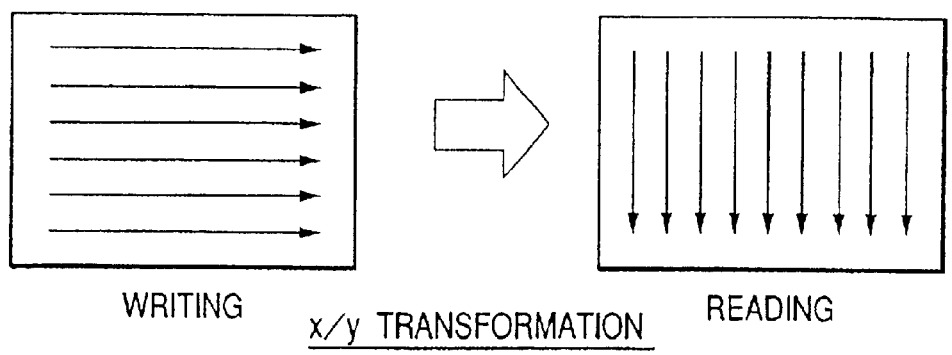
FIGS. 27A–27C are conceptual diagrams of the transforming of a series of pixels in FIG. 26.
Figure 27B:
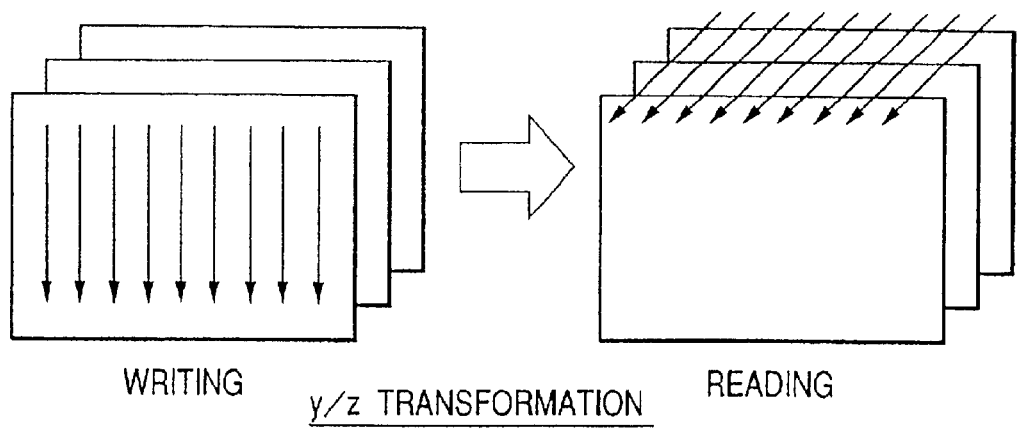
Figure 27C:
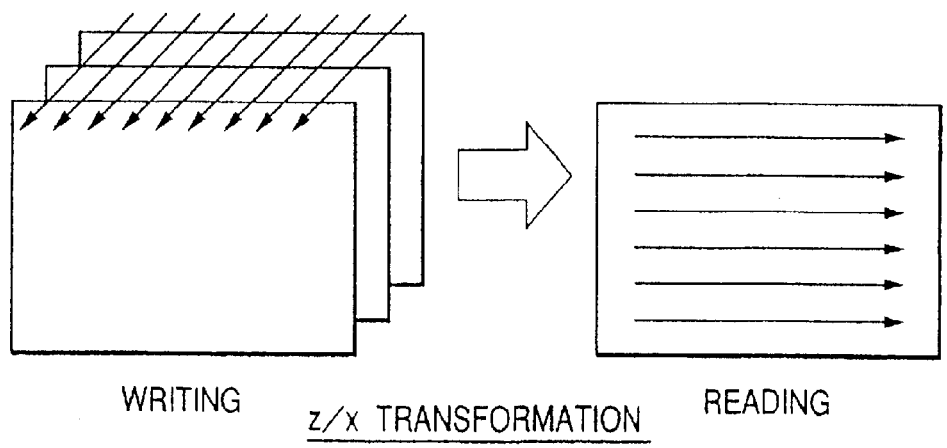

The above-described transformation processing in the series-of-levels transformation units 31, 33, and 35 is performed by providing frame memory, and performing reading from and writing into this (with switching a write address and a read address). FIG. 27 is a conceptual drawing of series-of-levels transformation by means of this write/read operation.

Figure 28:
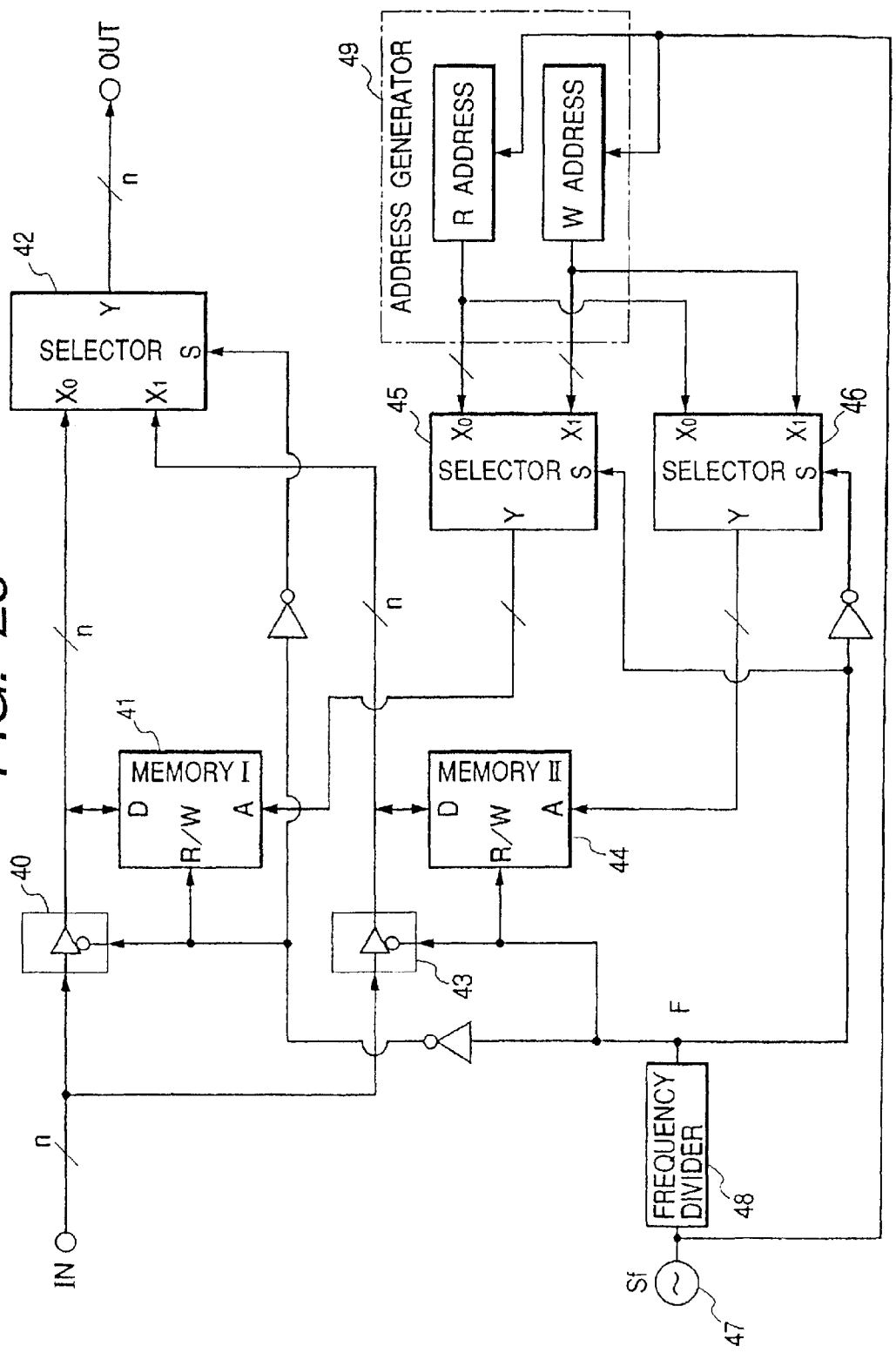
FIG. 28 is a concrete circuit diagram of a series-of-pixels transducer in FIG. 26 as an embodiment.

FIG. 28 is a diagram showing a concrete circuit diagram as an embodiment of the series-of-levels transformation unit. In this diagram, reference characters 41 and 44 denote image memory with predetermined capacity, reference characters 40 and 43 denote three-state buffers, reference characters 42, 45, and 46 denote selectors that select one of inputs $X_0$ and $X_1$ and make it as a Y output, and reference character 49 denotes an address generator composed of a write address and a read address. In addition, reference character 47 denotes a signal generator generating a clock at a sampling frequency, and reference character 48 denotes a frequency divider.

The transformation operation will be described with taking the x/y transformation processing as an example. The frequency divider 48 is made to divide the sampling frequency $S_f$ by two times the frame of pixels (m×n). Thus the frequency $F_f$ of the output F of the frequency divider is:

$$F_f = S_f/2 \times m \times n.$$

At this time, the output F of the frequency divider is a signal where "L" and "H" are alternately switched every m×n times the sampling cycle (FIG. 29(d)). The image memory 41 and 44 are made to include capacity corresponding to a frame, that is, m×n locations whose addresses are expressed in the following matrix with m rows and n columns.

$$\begin{bmatrix} (1,1) & (1,2) & (1,3) & K & (1,n) \\ (2,1) & (2,2) & (2,3) & K & (2,n) \\ (3,1) & & O & & M \\ M & & & O & M \\ (m,1) & \Lambda & \Lambda & \Lambda & (m,n) \end{bmatrix}$$

When the output F of the frequency divider is "H," "L" is applied to an R/W terminal of the image memory 41 and "H" is applied to an R/W terminal of the image memory 44, and hence, in this period, not only the image memory 41 becomes write memory, but also the image memory 44 becomes read memory. Although the image memory 41 and 44 are provided with a bilateral I/O terminal D respectively, at this time, an input signal is applied only to the D terminal of the memory 41 through the three-state buffer 40 and the output of the three-state buffer 43 becomes high impedance, and hence the output from the memory 44 is not applied to the memory 44 and also does not hinder the output of the memory 44. At this time, since S inputs to the selectors 45 and 46 are "H" and "L" respectively, $X_1$, that is, a W address is outputted from a Y output of the selector 45 and $X_0$, that is, an R address is outputted from a Y output of the selector 46, and respective addresses are applied to respective A terminals (address terminals) of the memory 41 and 44. More concretely, since W addresses (1, 1), (1, 2), (1, 3), (1, 4), . . . , (1, n), (2, 1), (2, 2), . . . , (2, n), . . . , and (m, n) are applied to the memory 41 in this order, the image signal is written in an ordinary scanning form (a left side in FIG. 27(a)). On the other hand, since R addresses (1, 1), (2, 1), (3, 1), (4, 1), . . . , (m, 1), (1, 2), (2, 2), . . . , (1, n), (2, n), . . . , and (m, n) are applied to the memory 44 in this order, the image signal is read in the vertical direction (a right side in FIG. 27(a)). Since the output F of the frequency divider 48 changes to "L" when a frame of writing and reading is completed, reading/writing functions of the memory 41 and 44 are quite reversed at this point, both memories operate so that data may be written into the memory 44 while data stored before may be read from the memory 41. In this manner, on the basis of the output F of the frequency divider, the horizontal writing and vertical reading of the image signal is controlled, and it is achieved to perform the x/y series-of-levels transformation that is the desired object. Although it is possible to perform the y/z transformation and z/x transformation with similar processing, in this case, it is necessary to provide memory capacity corresponding to intervals in the interframe direction to be interpolated. For example, in case processing in the interframe direction covering K frames is an object, it is necessary to provide image memory having capacity corresponding to K frames.

Figure 30A:
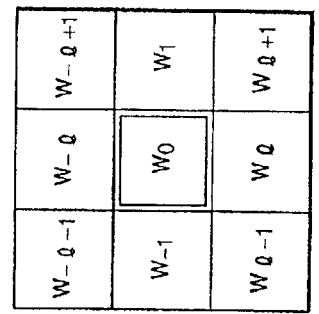
FIGS. 30A–30C are drawings showing a transversal filter executing the two-dimensional interpolation processing of an image signal.
Figure 30B:
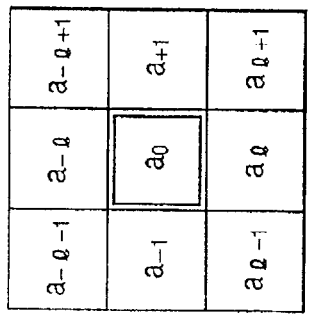
Figure 30C:
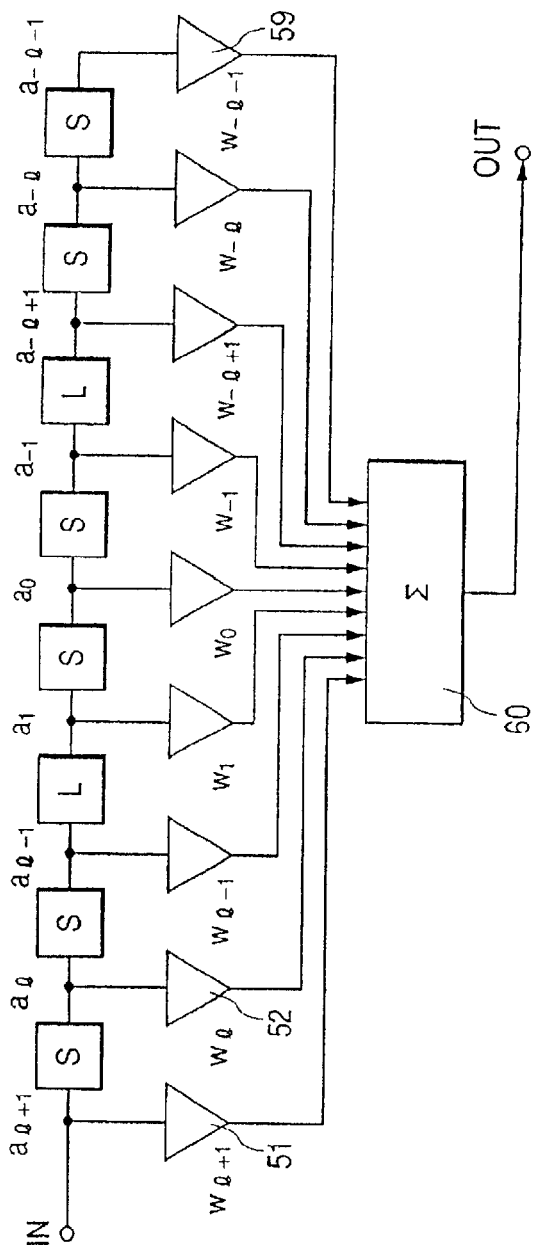

In addition, although, in the above-described embodiments of image signal processing, separate interpolation processing is performed in the horizontal direction and vertical direction in a frame, in-frame interpolation processing can be performed in a lump. For example, as shown in FIG. 30(c), it is conceivable to use transversal filter consisting of a plurality of sampling-cycle delay lines S and line-period delay lines L, multipliers 51 to 59 multiplying the input $a_{I+1}$, and outputs of respective delay lines, $a_1$ to $a_{I-1}$, by predetermined coefficients $W_{I+1}$ to $W_{-I-1}$, and an adder 60 summing the result of multiplication. In this example, with letting a block with 3×3 pixels (FIG. 30(a)) be a processing unit, and letting a gradation level of a pixel concerned be $a_0$, it is performed to multiply gradation levels of pixels near it, $a_{-I-1}$, $a_{-1}$, $a_{-I+1}$, . . . , $a_1$, $a_{I+1}$, by predetermined weights, that is, $W_{-I-1}$, $W_{-1}$, $W_{-I+1}$, . . . , $W_1$, $W_{I+1}$, its sum is made an output corresponding to $a_0$, next, the same calculation is performed for a pixel level $a_{+1}$, and this is performed for all the pixels in the frame. In addition, although, in the above-described description with reference to FIG. 30, the block with 3×3 pixels is took as an example for simplification, of course, it is also possible to perform calculation by using a necessary number of block size in consideration of an object of interpolation processing.

What is claimed is:

1. A method for processing a digital signal that has a predetermined sampling cycle and quantization bit length, said method comprising the steps of:

sequentially detecting signal intervals, where a plurality of same quantization levels continue;

determining a predetermined signal interval, including a discontinuous part between two signal intervals adjacent to each other, as an interpolation object interval;

detecting a degree of periodicity of a signal in an interval covering intervals before and after the interpolation object interval; and performing interpolation processing of signal levels in the interpolation object interval in accordance with a predetermined function curve with adaptively changing a change characteristic of the predetermined function curve that monotonously changes, on the basis of the degree of periodicity that is detected.

2. The method according to claim 1, wherein the characteristic of the function curve change so that the function curve may gently change when the degree of the periodicity of a signal is large, and the function curve may sharply change if the degree is small.

3. The method according to claim 1, wherein the step of performing interpolation processing includes a step of detecting the degree of periodicity of a signal by using frequency analysis.

4. The method according to claim 3, comprising letting each of intervals where the plurality of same levels continue be an interpolation object interval, and the frequency analysis measuring a level of a frequency component at a frequency f=½T where T is a time length of the interpolation object interval.

5. The method according to claim 1, wherein the step of performing interpolation processing includes a step of detecting the degree of periodicity of a signal by using auto-correlation function analysis.

6. An apparatus for processing a digital signal that has a predetermined sampling cycle and quantization bit length, said apparatus comprising:

means for sequentially detecting signal intervals, where a plurality of same levels continue;

means for determining a predetermined signal interval, including a discontinuous part between signal intervals, which are adjacent to each other and in which the same levels continue, as an interpolation object interval;

means for detecting a degree of periodicity of a signal in a interval covering intervals before and after the interpolation object interval; and means for performing interpolation processing of signal levels in the interpolation object interval in accordance with a predetermined function curve, which monotonously changes, by adaptively changing a change characteristic of the function curve, on the basis of the degree of periodicity that is detected.

7. The apparatus according to claim 6, wherein the interpolation means makes a characteristic of the function curve change so that the function curve may gently change when the degree of the periodicity of a signal is large, and the function curve may sharply change when the degree is small.

8. The apparatus according to claim 6, wherein the means for performing interpolation processing operates so as to detect the degree of periodicity of a signal by using frequency analysis.

9. The apparatus according to claim 8, comprising letting each of intervals where the same levels continue be an interpolation object interval, and the frequency analysis measuring a level of a frequency component at a frequency $f=\frac{1}{2}T$ where T is a time length of the interpolation object interval.

10. The apparatus according to claim 6, wherein the means for performing interpolation processing operates so as to detect the degree of periodicity of a signal by using auto-correlation function analysis.

* * * * *